(12) United States Patent
Landman et al.

(10) Patent No.: US 11,841,395 B2
(45) Date of Patent: Dec. 12, 2023

(54) INTEGRATED CIRCUIT MARGIN MEASUREMENT AND FAILURE PREDICTION DEVICE

(71) Applicant: PROTEANTECS LTD., Haifa (IL)

(72) Inventors: Evelyn Landman, Haifa (IL); Shai Cohen, Haifa (IL); Yahel David, Kibbutz Gazit (IL); Eyal Fayneh, Givatayim (IL); Inbar Weintrob, Givat-Ada (IL)

(73) Assignee: PROTEANTECS LTD., Haifa (IL)

( * ) Notice: Subject to any disclaimer, the term of this patent is extended or adjusted under 35 U.S.C. 154(b) by 0 days.

(21) Appl. No.: 17/862,142

(22) Filed: Jul. 11, 2022

(65) Prior Publication Data

US 2023/0046999 A1 Feb. 16, 2023

Related U.S. Application Data

(63) Continuation of application No. 16/764,056, filed as application No. PCT/IL2018/051234 on Nov. 15, 2018, now Pat. No. 11,385,282.
(Continued)

(51) Int. Cl.
*G01R 31/28* (2006.01)
*G01R 31/30* (2006.01)

(52) U.S. Cl.
CPC ..... *G01R 31/2881* (2013.01); *G01R 31/3016* (2013.01)

(58) Field of Classification Search
None
See application file for complete search history.

(56) References Cited

U.S. PATENT DOCUMENTS 4,555,663 A * 11/1985 Shimizu ........... G01R 31/31908
714/738
5,548,539 A 8/1996 Vlach et al.
(Continued)

FOREIGN PATENT DOCUMENTS

CN 101014991 A 8/2007
CN 101344898 A 1/2009
(Continued)

OTHER PUBLICATIONS

Zheng K., "A Comparison of Digital Droop Detection Techniques in ASAP7 FinFET"; Research Review. Sep. 2019.
(Continued)

*Primary Examiner* — Jermele M Hollington
(74) *Attorney, Agent, or Firm* — The Roy Gross Law Firm, LLC; Roy Gross

(57) ABSTRACT

A semiconductor integrated circuit (IC) comprising a signal path combiner, comprising a plurality of input paths and an output path. The IC comprises a delay circuit having an input electrically connected to the output path, the delay circuit delaying an input signal by a variable delay time to output a delayed signal path. The IC may comprise a first storage circuit electrically connected to the output path and a second storage circuit electrically connected to the delayed signal path. The IC comprises a comparison circuit that compares outputs of the signal path combiner and the delayed signal, wherein the comparison circuit comprises a comparison output provided in a comparison data signal to at least one mitigation circuit.

19 Claims, 11 Drawing Sheets

Related U.S. Application Data

(60) Provisional application No. 62/586,423, filed on Nov. 15, 2017.

(56) References Cited

U.S. PATENT DOCUMENTS

| | | | |
|---|---|---|---|
| 5,748,509 A | 5/1998 | Fewster |
| 5,774,403 A | 6/1998 | Clark, II et al. |
| 5,818,251 A | 10/1998 | Intrater |
| 5,895,629 A | 4/1999 | Russell et al. |
| 5,956,497 A | 9/1999 | Ratzel et al. |
| 5,966,527 A | 10/1999 | Krivokapic et al. |
| 6,182,253 B1 | 1/2001 | Lawrence et al. |
| 6,486,716 B1 | 11/2002 | Minami et al. |
| 6,586,921 B1 | 7/2003 | Sunter |
| 6,683,484 B1 | 1/2004 | Kueng et al. |
| 6,807,503 B2 | 10/2004 | Ye et al. |
| 6,873,926 B1 | 3/2005 | Diab |
| 6,882,172 B1 | 4/2005 | Suzuki et al. |
| 6,948,388 B1 | 9/2005 | Clayton et al. |
| 7,038,483 B1 | 5/2006 | Suzuki et al. |
| 7,067,335 B2 | 6/2006 | Weiner et al. |
| 7,254,507 B2 | 8/2007 | Dosho et al. |
| 7,369,893 B2 | 5/2008 | Gunderson |
| 7,443,189 B2 | 10/2008 | Ramappa |
| 7,455,450 B2 | 11/2008 | Liu et al. |
| 7,501,832 B2 | 3/2009 | Spuhler et al. |
| 7,649,373 B2 | 1/2010 | Tokunaga |
| 7,701,246 B1 | 4/2010 | Plants et al. |
| 7,818,601 B2 | 10/2010 | LaBerge |
| 7,877,657 B1 | 1/2011 | Miller et al. |
| 8,001,512 B1 | 8/2011 | White |
| 8,086,978 B2 | 12/2011 | Zhang et al. |
| 8,279,976 B2 | 10/2012 | Lin et al. |
| 8,310,265 B2 | 11/2012 | Zjajo et al. |
| 8,365,115 B2 | 1/2013 | Liu et al. |
| 8,418,103 B2 | 4/2013 | Wang et al. |
| 8,479,130 B1 | 7/2013 | Zhang et al. |
| 8,633,722 B1 * | 1/2014 | Lai ................. G01R 31/2882 |
| | | 327/263 |
| 8,825,158 B2 | 9/2014 | Swerdlow |
| 9,424,952 B1 | 8/2016 | Seok et al. |
| 9,490,787 B1 | 11/2016 | Kho et al. |
| 9,536,038 B1 | 1/2017 | Quinton et al. |
| 9,564,883 B1 | 2/2017 | Quinton et al. |
| 9,564,884 B1 | 2/2017 | Quinton et al. |
| 9,632,126 B2 | 4/2017 | Yoon et al. |
| 9,714,966 B2 | 7/2017 | Chen et al. |
| 9,760,672 B1 | 9/2017 | Taneja et al. |
| 9,791,834 B1 * | 10/2017 | Nassar ................. G04F 10/005 |
| 9,954,455 B2 | 4/2018 | Lin et al. |
| 9,991,879 B2 | 6/2018 | Huang |
| 10,490,547 B1 | 11/2019 | Ali et al. |
| 10,509,104 B1 | 12/2019 | Dato |
| 10,530,347 B2 | 1/2020 | Tang et al. |
| 11,081,193 B1 | 8/2021 | Tang |
| 11,385,282 B2 * | 7/2022 | Landman ........... G01R 31/3016 |
| 11,409,323 B2 | 8/2022 | Herberholz et al. |
| 2004/0009616 A1 | 1/2004 | Huisman et al. |
| 2004/0015793 A1 | 1/2004 | Saxena et al. |
| 2004/0230385 A1 | 11/2004 | Bechhoefer et al. |
| 2004/0230396 A1 | 11/2004 | Ye |
| 2005/0114056 A1 | 5/2005 | Patel et al. |
| 2005/0134350 A1 | 6/2005 | Huang et al. |
| 2005/0134394 A1 | 6/2005 | Liu |
| 2006/0049886 A1 | 3/2006 | Agostinelli et al. |
| 2006/0224374 A1 | 10/2006 | Kwon et al. |
| 2007/0110199 A1 | 5/2007 | Momtaz et al. |
| 2007/0182456 A1 | 8/2007 | Agarwal et al. |
| 2008/0074521 A1 | 3/2008 | Olsen |
| 2008/0144243 A1 | 6/2008 | Mariani et al. |
| 2008/0147355 A1 | 6/2008 | Fields et al. |
| 2008/0183409 A1 | 7/2008 | Roberts et al. |
| 2008/0186001 A1 | 8/2008 | Singh et al. |
| 2008/0186044 A1 | 8/2008 | Singh |
| 2008/0262769 A1 | 10/2008 | Kadosh et al. |
| 2009/0027077 A1 | 1/2009 | Vijayaraghavan et al. |
| 2009/0076753 A1 | 3/2009 | Mjayaraghavan |
| 2009/0096495 A1 | 4/2009 | Keigo |
| 2009/0183043 A1 | 7/2009 | Niwa |
| 2009/0230947 A1 | 9/2009 | Sumita |
| 2009/0244998 A1 | 10/2009 | Kim |
| 2009/0273550 A1 | 11/2009 | Vieri et al. |
| 2009/0278576 A1 | 11/2009 | Chakravarty |
| 2009/0306953 A1 | 12/2009 | Liu et al. |
| 2010/0153896 A1 | 6/2010 | Sewall et al. |
| 2010/0251046 A1 | 9/2010 | Mizuno et al. |
| 2010/0253382 A1 | 10/2010 | Wang et al. |
| 2011/0093830 A1 | 4/2011 | Chen et al. |
| 2011/0102091 A1 | 5/2011 | Yeric |
| 2011/0109377 A1 | 5/2011 | Fujibe et al. |
| 2011/0187433 A1 | 8/2011 | Baumann et al. |
| 2011/0267096 A1 | 11/2011 | Chlipala et al. |
| 2011/0295403 A1 | 12/2011 | Higuchi et al. |
| 2011/0315986 A1 | 12/2011 | Kaneda et al. |
| 2012/0025846 A1 | 2/2012 | Minas et al. |
| 2012/0038388 A1 | 2/2012 | Tseng et al. |
| 2012/0074973 A1 | 3/2012 | Baldwin et al. |
| 2012/0163074 A1 | 6/2012 | Franca-Neto et al. |
| 2012/0187991 A1 | 7/2012 | Sathe |
| 2012/0212246 A1 | 8/2012 | Benjamin et al. |
| 2012/0217976 A1 | 8/2012 | Clarkson |
| 2012/0242490 A1 * | 9/2012 | Ramaswami ............. G06F 1/28 |
| | | 340/663 |
| 2013/0226491 A1 | 8/2013 | Miguelanez et al. |
| 2013/0293270 A1 | 11/2013 | Lee et al. |
| 2013/0335875 A1 | 12/2013 | Baumann |
| 2014/0132293 A1 | 5/2014 | Abadir et al. |
| 2014/0184243 A1 | 7/2014 | Iyer et al. |
| 2014/0254734 A1 | 9/2014 | Abdelmoneum |
| 2015/0061707 A1 | 3/2015 | Balasubramanian et al. |
| 2015/0077136 A1 | 3/2015 | Li |
| 2015/0121158 A1 * | 4/2015 | Wang ............. G01R 31/318566 |
| | | 714/726 |
| 2015/0199223 A1 | 7/2015 | Banerjee et al. |
| 2015/0332451 A1 | 11/2015 | Amzaleg |
| 2015/0365049 A1 | 12/2015 | Ozawa et al. |
| 2016/0042784 A1 | 2/2016 | Rim et al. |
| 2016/0072511 A1 | 3/2016 | Maekawa |
| 2016/0087643 A1 | 3/2016 | Nozaki |
| 2016/0131708 A1 | 5/2016 | Huang et al. |
| 2016/0153840 A1 | 6/2016 | Huang et al. |
| 2016/0156176 A1 | 6/2016 | Kunz, Jr. et al. |
| 2016/0164503 A1 | 6/2016 | Kim et al. |
| 2016/0203036 A1 | 7/2016 | Mezic et al. |
| 2017/0038265 A1 | 2/2017 | Abdelmoneum et al. |
| 2017/0179173 A1 | 6/2017 | Mandai et al. |
| 2017/0199089 A1 | 7/2017 | Fritchman et al. |
| 2017/0199228 A1 | 7/2017 | Hsieh et al. |
| 2017/0214516 A1 | 7/2017 | Rivaud et al. |
| 2017/0329391 A1 | 11/2017 | Jaffari |
| 2017/0344102 A1 | 11/2017 | Kolla |
| 2017/0364818 A1 | 12/2017 | Wu et al. |
| 2018/0034549 A1 | 2/2018 | Kikuchi |
| 2018/0183413 A1 | 6/2018 | Wong |
| 2018/0365974 A1 | 12/2018 | Haas et al. |
| 2019/0019096 A1 | 1/2019 | Yoshida et al. |
| 2019/0117122 A1 | 4/2019 | Kurachi et al. |
| 2019/0305074 A1 | 10/2019 | Kande et al. |
| 2020/0028514 A1 | 1/2020 | Hanke |
| 2020/0203333 A1 | 6/2020 | Chen |
| 2023/0098071 A1 | 3/2023 | Chonnad et al. |

FOREIGN PATENT DOCUMENTS

| | | |
|---|---|---|
| CN | 102273077 B | 9/2014 |
| CN | 102422169 A | 11/2014 |
| CN | 108534866 A | 9/2018 |
| DE | 102012219971 A1 | 7/2016 |
| EP | 2006784 A1 | 12/2008 |
| EP | 2060924 A1 | 5/2009 |
| EP | 2413150 A1 | 2/2012 |
| JP | 2000215693 A | 8/2000 |
| JP | 2002243800 A | 8/2002 |

(56) References Cited

FOREIGN PATENT DOCUMENTS

| | | |
|---|---|---|
| JP | 2008147245 A | 6/2008 |
| JP | 2009065533 A | 3/2009 |
| JP | 2009021348 A | 7/2013 |
| KR | 2013110989 A | 10/2013 |
| KR | 20150073199 A | 6/2015 |
| TW | 201614256 A | 3/2016 |
| WO | 2005080099 A1 | 9/2005 |
| WO | 2013027739 A1 | 3/2015 |
| WO | 2019097516 A1 | 5/2019 |
| WO | 2019102467 A1 | 5/2019 |
| WO | 2019135247 A1 | 7/2019 |
| WO | 2019202595 A1 | 10/2019 |
| WO | 2019244154 A1 | 12/2019 |
| WO | 2020141516 A1 | 7/2020 |
| WO | 2020230130 A1 | 11/2020 |
| WO | 2021019539 A1 | 2/2021 |
| WO | 2021214562 A1 | 10/2021 |
| WO | 2022/009199 A1 | 1/2022 |

OTHER PUBLICATIONS

Hongge Chen, "Novel Machine Learning Approaches for Modeling Variations in Semiconductor Manufacturing," Master thesis, Jun. 2017.

Kan Takeuchi et al; "FEOL/BEOL wear-out estimator using stress-to-frequency conversion of voltage/temperature-sensitive ring oscillators for 28nm automotive MCUs"; IEEE, pp. 265-268, Oct. 20, 2016.

Kan Takeuchi et al; "Wear-out stress monitor utilising temperature and voltage sensitive ring oscillators" IET Circuits, Devices & Systems. vol. 12 No. 2, pp. 182-188, Jan. 15, 2018.

Kan Takeuchi et al; "Experimental Implementation of 8.9Kgate Stress Monitor in 28nm MCU along with Safety Software Library for IoT Device Maintenance"; IEEE International Reliability Physics Symposium (IRPS). Mar. 31, 2019.

Dan Ernst et al; "Razor: Circuit-Level Correction of Timing Errors for Low-Power Operation"; IEEE Computer Society. Nov. 30, 2004.

Dan Ernst et al; "Razor: A Low-Power Pipeline Based on Circuit-Level Timing Speculation"; Appears in the 36th Annual International Symposium on Microarchitecture (Micro-36). Dec. 1, 2003.

James P. Hofmeister, et al, "Ball Grid Array (BGA) Solder Joint Intermittency Detection: SJ BIST™", IEEE Aerospace Conference Proceedings, Apr. 2008, paper #1148, Version 1.

Paulheim H, Meusel R. "A decomposition of the outlier detection problem into a set of supervised learning problems", Machine Learning, Sep. 2015, vol. 100 Issue 2, pp. 509-531.

Zhang L, Marron JS, Shen H, Zhu Z., "Singular value decomposition and its visualization", Journal of Computational and Graphical Statistics, Dec. 2007, vol. 6 Issue 4, pp. 833-854.

Shinkai, Ken-ichi et al. "Device-parameter estimation with on-chip variation sensors considering random variability."; In 16th Asia and South Pacific Design Automation Conference (ASP-DAC 2011), pp. 683-688. IEEE, Jan. 25, 2011.

Weiwei Shan et al. "An improved timing error prediction monitor for wide adaptive frequency scaling"; IEICE Electronics Express, vol. 14, No. 21, pp. 1-6, Oct. 20, 2017.

Agilent Technologies; "Clock Jitter Analysis with femto-second resolution"; Jan. 1, 2008.

Yousuke Miyake et al; "Temperature and voltage estimation using ring oscillator-based monitor for field test"; IEEE 23rd Asian Test Symposium; pp. 156-161, Nov. 16, 2014.

Basab Datta at al; "Analysis of a Ring Oscillator Based On Chip Thermal Sensor in 65nm Technology"; Online at: https://web.archive.org/web/20140328234617/http://www-unix.ecs.umass.edu/~dkumar/ab4_658_report/lab4_report.htm; Sep. 5, 2018.

Tilman Wolf et al; "Collaborative Monitors for Embedded System Security". Jan. 1, 2006.

Sandeep Kumar Samal et al; "Machine Learning Based Variation Modeling and Optimization for 3D ICs"; J. Inf. Commun. Converg. Eng. 14(4): 258-267, Dec. 2016.

Yin-Nien Chen et al; "Impacts of Work Function Variation and Line-Edge Roughness on TFET and FinFET Devices and 32-Bit CLA Circuits"; J. Low Power Electron. Appl. 2015, 5, 101-115. May 21, 2015.

Yong Zhao et al; "A Genetic Algorithm Based Remaining Lifetime Prediction for a VLIW Processor Employing Path Delay and IDDX Testing"; IEEE; Apr. 12, 2016.

Vivek S Nandakumar et al, "Statistical static timing analysis flow for transistor level macros in a microprocessor"; 2010, 11th International Symposium on Quality Electronic Design (ISQED), pp. 163-170, Mar. 22, 2010.

Jing Li et al, "Variation Estimation and Compensation Technique in Scaled LTPS TFT Circuits for Low-Power Low-Cost Applications"; IEEE Transactions on Computer-Aided Design of Integrated Circuits and Systems, vol. 28(1): 46-59, Jan. 1, 2009.

Xie Qing et al "Variation-Aware Joint Optimization of the Supply Voltage and Sleep Transistor Size for 7nm FinFET Technology"; 2014 IEEE 32nd international conference on computer design, pp. 380-385, Oct. 19, 2014.

Rebaud B et al , "Timing slack monitoring under process and environmental variations: Application to a DSP performance optimization"; Microelectronics Journal vol. 42 Issue 5, pp. 718-732, Feb. 8, 2011.

Dierickx B et al, "Propagating variability from technology to system Level"; Physics of Semiconductor Devices, pp. 74-79, Dec. 16, 2007.

Nidhal Selmane, Shivam Bhasin, Sylvain Guilley, Tarik Graba, Jean-Luc Danger. "WDDL is Protected Against Setup Time Violation Attacks." CHES, Sep. 2009, Lausanne, Switzerland. pp. 73-83.

Nidhal Selmane, Shivam Bhasin, Sylvain Guilley, Jean-Luc Danger. "Security evaluation of application-specific integrated circuits and field programmable gate arrays against setup time violation attacks." IET Inf. Secur., 2011, vol. 5, Iss. 4, pp. 181-190.

Jianfeng Zhang et al, "Parameter Variation Sensing and Estimation in Nanoscale Fabrics"; Journal of Parallel and Distributed Computing; vol. 74, Issue 6, pp. 2504-2511, Jun. 1, 2014. https://doi.org/10.1016/j.jpdc.2013.08.005.

I. A. K. M. Mahfuzul et al, "Variation-sensitive monitor circuits for estimation of Die-to-Die process variation"; 2011 IEEE ICMTS International Conference on Microelectronic Test Structures, Amsterdam, Netherlands; pp. 153-157, Apr. 4-7, 2011. doi: 10.1109/ICMTS.2011.5976878.

Ying Qiao et al, "Variability aware compact modeling and statistical circuit validation on SRAM test array"; Proceedings of the SPIE, vol. 9781, Design-Process-Technology Co-optimization for Manufacturability X, Mar. 16, 2016. DOI: 10.1117/12.2219428.

David Herres, "The Eye Diagram: What is it and why is it used?"; Online at: https://www.testandmeasurementtips.com/basics-eye-diagrams/, Aug. 16, 2016.

Yu-Chuan Lin et al, "A 10-GB/s Eye Opening Monitor Circuit for Receiver Equalizer Adaptations in 65-nm CMOS;" in IEEE Transactions on Very Large Scale Integration (VLSI) Systems, vol. 28, No. 1, pp. 23-34, Jan. 2020. doi: 10.1109/TVLSI.2019.2935305.

* cited by examiner

INTEGRATED CIRCUIT MARGIN MEASUREMENT AND FAILURE PREDICTION DEVICE

CROSS REFERENCE TO RELATED APPLICATIONS

This application is a continuation of U.S. patent application Ser. No. 16/764,056, filed May 14, 2020, entitled "Integrated Circuit Margin Measurement and Failure Prediction Device," now U.S. Pat. No. 11,385,282, which is a national phase of PCT Patent Application No. PCT/IL2018/051234, filed Nov. 15, 2018, entitled "Integrated Circuit Margin Measurement and Failure Prediction Device," which claims priority to U.S. Provisional Patent Application No. 62/586,423, filed Nov. 15, 2017, entitled "Integrated Circuit Failure Prediction Device," the contents of all of which are all incorporated herein by reference in their entirety.

FIELD OF THE INVENTION

The invention relates to the field of integrated circuits.

BACKGROUND

Integrated circuits (ICs) may include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, that have commoditized the production of ICs, such as complementary metal-oxide-semiconductor (CMOS) ICs. Digital ICs contain billions of transistors arranged in functional and/or logical units on the wafer, with data-paths interconnecting the functional units that transfer data values between the functional units. As used herein, the term "data-path" means a parallel series of electronic connections, or paths, for transferring data signals between functional/logical units of an IC, and each data-path may include a specific number of bit paths, such as 64, 128, 256, ort the like. During the IC design process, the timing of the functional units is arranged so that each functional unit may usually complete the required processing of that unit within a single clock cycle. A safety factor may be used to account for manufacturing differences of individual ICs and possible changes, such as degradations, over the planned lifetime of the IC.

The degrading of an IC's transistors over time is termed aging. For example, the degradation of transistors overtime leads slowly to decreased switching speeds, and may even result in outright circuit failures, when they exceed the design safety factors. Usually, the design process incorporates these delays into the design such that the ICs will not fail during their normal lifetime, but environmental and usage conditions (such as heat, voltage, current, humidity, and/or the like) may accelerate the aging process.

IC transistors, such as bipolar transistors, metal-oxide semiconductor field-effect transistors (MOSFETs), and/or the like, may be used in digital ICs and may function as electrical switches. For example, a MOSFET may have four terminals, such as the body, the gate, the source, and the drain, yet typically the source and body are electrically connected. The voltage applied to the gate may determine the amount of current that flows between the source and drain. A thin layer of dielectric material electrically insulates the gate, and the electric field applied across the gate may alter the conductivity of the underlying semiconductor channel between the source and drain.

With use, charge carriers (such as electrons for negative, or n-channel, MOSFETs, or holes for positive, or p-channel, MOSFETs) that have more energy than the average charge carrier may stray out of the conductive channel between the source and drain, and become trapped in the insulating dielectric. This process, termed hot-carrier injection (HCI), may eventually build up electric charge within the dielectric layer, and thus increase the voltage needed to operate the transistor. As the threshold voltage increases, the transistor switching delay may become larger.

Another aging mechanism occurs when a voltage is applied to the gate, a phenomenon termed bias temperature instability (BTI). BTI may cause a buildup of charge in the dielectric, among other issues, though, some of this effect spontaneously disappears after that gate voltage is removed. This recovery occurs within a few microseconds, making it difficult to observe when a transistor is stressed and then the resulting effects are measured only after the stress is removed.

Another aging mechanism comes into play when a voltage applied to the gate may create electrically active defects, known as traps, within the dielectric. When traps become too numerous, these charge traps may join and form an outright short circuit between the gate and the current channel. This kind of failure is termed oxide breakdown, or time-dependent dielectric breakdown. Unlike the other aging mechanisms, which cause a gradual decline in performance, the breakdown of the dielectric may lead to a catastrophic failure of the transistor, causing the IC to malfunction.

Additionally, a phenomenon called electromigration may damage the copper or aluminum connections that tie transistors together or link them to the outside world. Electromigration may occur when a surge of current knocks metal atoms loose from the electrical connections, and may cause them to flow with the electrons. This depletes the metal of some atoms upstream, while causing a buildup of metal downstream. The upstream thinning of the metal increases the electrical resistance of the connection, sometimes becoming an open circuit. The downstream deposition may cause the metal to bulge out of its designated track.

Another reliability related issue in ICs is a phenomenon called stress migration. This is used to describe the flow of metal atoms under the influence of mechanical stress.

Additionally, any defect, such as un-modeled phenomenon, random manufacturing defects, and/or the like, may cause a timing degradation of a signal path over time. Some defects may not appear during testing, verification, initial operation, and/or the like, for example, the die/IC/product may pass all the screening procedures at the testing stage. For example, a via that includes a manufacturing defects, such as less that complete metal coverage, will increase its resistance over time and at some point, causes a timing failure of a logic path. For example, random manufacturing defects may appear anywhere on the IC, and incorporate a large variety of types and levels of defects, so designs may not be able to incorporate safety factors to mitigate these defects. On the other hand, aspects of embodiments of the disclosed techniques may be able to predict the failure of each individual IC based on fingerprint sampling at appropriate IC pathways, and mitigate the failure by preemptive replacement, corrective and preventative actions, notifications to users, compensations within the IC to increase time lifetime, and/or the like.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

There is provided, in accordance with an embodiment, a semiconductor integrated circuit (IC) in accordance with the claims. This may comprise a signal path combiner, comprising a plurality of input paths and an output path. The IC comprises a delay circuit having an input electrically connected to the output path, the delay circuit delaying an input signal by a variable delay time to output a delayed signal path. The IC may comprise a first storage circuit electrically connected to the output path and a second storage circuit electrically connected to the delayed signal path. The IC comprises a comparison circuit that compares outputs of the first and second storage circuits, wherein the comparison circuit comprises a second output path electrically connected to one or more mitigation circuit.

In some embodiments, the mitigation circuit is one or more circuit from the group consisting of: a notification circuit; a timing delay measurement (or estimation) circuit; a data transmission circuit; an IC anti-aging compensation circuit; and a failure analysis circuit.

In some embodiments, the signal path combiner is one or more from the group consisting of a logical XOR combiner, a Hamming parity combiner, and multiplexer.

In some embodiments, the variable delay time is set in an integer multiple of increments equal to a clock period of the IC divided by a signature vector size, and wherein the signature vector size is between 1 and 100,000.

In some embodiments, the mitigation circuit is a data transmission circuit electronically connected to a computerized server, wherein the computerized server is configured to receive multiple instances of the comparison data signal, perform a failure prediction analysis of the comparison data signals, and send a notification a mitigation module when the failure prediction analysis predicts failure of the IC within a predefined time.

In some embodiments, at least some of the comparison data signals are generated at multiple values of the variable delay time.

In some embodiments, at least some of the comparison data signals are generated from multiple instances of one or more value from multiple values of the variable delay time.

In some embodiments, the failure prediction analysis comprises one or more of a machine learning analysis, a trend analysis, a multiple object tracking analysis, and a multivariant analysis.

In some embodiments, the failure prediction analysis comprises receiving comparison data signals from multiple different ICs.

In some embodiments, the failure prediction analysis comprises receiving failure prediction analysis results from multiple different ICs.

In a further aspect, which may be combinable with any embodiment described herein, there is provided a semiconductor integrated circuit (IC) comprising: a signal path combiner, comprising a plurality of input paths and an output, the output being based on a combination of respective signals received on each of the input paths; a delay circuit having an input electrically connected to the signal path combiner output, the delay circuit delaying an input signal by a variable delay time to output a delayed signal; and a comparison circuit arranged to provide a comparison output based on a comparison of the signal path combiner output and the delayed signal, wherein the comparison output is provided in a comparison data signal to at least one mitigation circuit.

In some embodiments, the mitigation circuit is at least one circuit from the group consisting of: a notification circuit; a timing delay measurement circuit; a data transmission circuit; an IC anti-aging compensation circuit; and a failure analysis circuit.

Optionally, the signal path combiner is at least one from the group consisting of a logical XOR combiner, a Hamming parity combiner, and multiplexer.

In an embodiment, the IC further comprises: a first internal storage circuit, electrically connected to the signal path combiner output and arranged to provide the stored signal path combiner output as a first input to the comparison circuit; and a second internal storage circuit, electrically connected to the delayed signal and arranged to provide the delayed signal as a second input to the comparison circuit.

In certain embodiments, the signal path combiner is a first signal path combiner arranged to receive a plurality of signals from a first data source and the comparison circuit is a first comparison circuit. Then, the IC may further comprise: a second signal path combiner, comprising a plurality of input paths and an output, the second signal path combiner output being based on a combination of respective signals received on each of the input paths, the signals being received from a second data source; a multiplexer, configured to receive the first signal path combiner output, the second signal path combiner output and a selection signal and to selectively output the first signal path combiner output or the second signal path combiner output based on the selection signal, the output of the multiplexer being provided as the input to the delay circuit; a second comparison circuit arranged to provide a second comparison output based on a comparison of the second signal path combiner output and the delayed signal; and an OR gate arranged to receive as inputs the first comparison output and the second comparison output and to provide an output as the comparison data signal to the at least one mitigation circuit.

The IC optionally, further comprises: a first comparison storage circuit, arranged to receive the first comparison output and controlled by a first clock signal; a second comparison storage circuit, arranged to receive the second comparison output and controlled by a second clock signal; and wherein the first comparison storage circuit is arranged to provide the first comparison output as a first input to the OR gate and the second comparison storage circuit is arranged to provide the second comparison output as a second input to the OR gate.

In some embodiments the variable delay time is set in an integer multiple of increments equal to a clock period of the IC divided by a signature vector size, and wherein the signature vector size is between 1 and 100,000.

In embodiments, the mitigation circuit is a data transmission circuit electronically connected to a computerized server, wherein the computerized server is configured to receive multiple instances of the comparison data signal, perform a failure prediction analysis of the comparison data signals, and send a notification to a mitigation module when the failure prediction analysis predicts failure of the IC within a predefined time. Optionally, at least some of the comparison data signals are generated at multiple values of the variable delay time. Preferably, at least some of the comparison data signals are generated from multiple instances of at least one value from multiple values of the variable delay time.

In certain embodiments, the failure prediction analysis comprises at least one of a machine learning analysis, a trend analysis, a multiple object tracking analysis, and a multi-variant analysis.

In embodiments, the failure prediction analysis comprises receiving comparison data signals from multiple different ICs.

In some embodiments, the failure prediction analysis comprises receiving failure prediction analysis results from multiple different ICs.

In some embodiments, each of the plurality of input paths of the signal path combiner is configured to receive one of: a signal from a respective data source in the IC; a signal from a memory circuit; and a signal from one of a plurality of logic circuits grouped by a clock enable.

In another aspect (combinable with any other embodiment described herein), there may be considered a method for using a semiconductor integrated circuit (IC), the method comprising: combining respective signals received on each of a plurality of input paths at a signal path combiner to provide an output; delaying the signal path combiner output by a variable delay time at a delay circuit to output a delayed signal; and comparing the signal path combiner output and the delayed signal to provide a comparison output and providing the comparison output in a comparison data signal to at least one mitigation circuit.

In some embodiments, the mitigation circuit is at least one circuit from the group consisting of: a notification circuit; a timing delay measurement circuit; a data transmission circuit; an IC anti-aging compensation circuit; and a failure analysis circuit.

In embodiments, the signal path combiner is at least one from the group consisting of a logical XOR combiner, a Hamming parity combiner, and multiplexer.

Optionally, the method further comprises: storing the signal path combiner output at a first internal storage circuit and providing the stored signal path combiner output from the first internal storage circuit as a first input to the comparison circuit; and storing the delayed signal at a second internal storage circuit and providing the delayed signal from the second internal storage circuit as a second input to the comparison circuit.

In certain embodiments, the signal path combiner is a first signal path combiner that receives a plurality of signals from a first data source and wherein the comparison circuit is a first comparison circuit. Then, the method may further comprise: combining respective signals received on each of a plurality of input paths at a second signal path combiner to provide an output, the signals being received from a second data source; receiving the first signal path combiner output, the second signal path combiner output and a selection signal at a multiplexer and selectively outputting the first signal path combiner output or the second signal path combiner output based on the selection signal, the output of the multiplexer being provided as the input to the delay circuit such that the step of delaying comprises delaying the first signal path combiner output or the second signal path combiner output by the variable delay time at the delay circuit to output the delayed signal; comparing the second signal path combiner output and the delayed signal to provide a second comparison output; and receiving at an OR gate, the first comparison output and the second comparison output as inputs and outputting the comparison data signal as an output from the OR gate to the at least one mitigation circuit.

In some embodiments, the method further comprises: receiving the first comparison output at a first comparison storage circuit controlled by a first clock signal; receiving the second comparison output at a second comparison storage circuit controlled by a second clock signal; providing the first comparison output from the first comparison storage circuit as a first input to the OR gate; and providing the second comparison output from the second comparison storage circuit as a second input to the OR gate.

In embodiments, the variable delay time is set in an integer multiple of increments equal to a clock period of the IC divided by a factor from 1 to 100,000.

In some embodiments, the mitigation circuit is a data transmission circuit electronically connected to a computerized server, the method further comprising: receiving multiple instances of the comparison data signal at the computerized server; performing a failure prediction analysis of the comparison data signals at the computerized server; sending a notification from the computerized server to a mitigation module when the failure prediction analysis predicts failure of the IC within a predefined time. Optionally, at least some of the comparison data signals are generated at multiple values of the variable delay time. Preferably, at least some of the comparison data signals are generated from multiple instances of at least one value from multiple values of the variable delay time.

In some embodiments, the failure prediction analysis comprises at least one of a machine learning analysis, a trend analysis, a multiple object tracking analysis, and a multi-variant analysis.

In certain embodiments, the failure prediction analysis comprises receiving comparison data signals from multiple different ICs.

In embodiments, the failure prediction analysis comprises receiving failure prediction analysis results from multiple different ICs.

Optionally, each of the plurality of input paths of the signal path combiner is configured to receive one of: a signal from a respective data source in the IC; a signal from a memory circuit; and a signal from one of a plurality of logic circuits grouped by a clock enable.

In embodiments, the method is performed at an initial operation of the IC. Then, the method may further comprise: measuring a timing delay for the IC, based on the comparison data signal provided to the mitigation circuit.

In some embodiments, the method further comprises: repeating the steps of combining, delaying and comparing for each of a plurality of delay times, in order to provide a plurality of comparison outputs; and determining an identifying characteristic for the IC based on the plurality of comparison outputs. Optionally, the method further comprises: tracking changes in the identifying characteristic for the IC over time.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Figure 1:
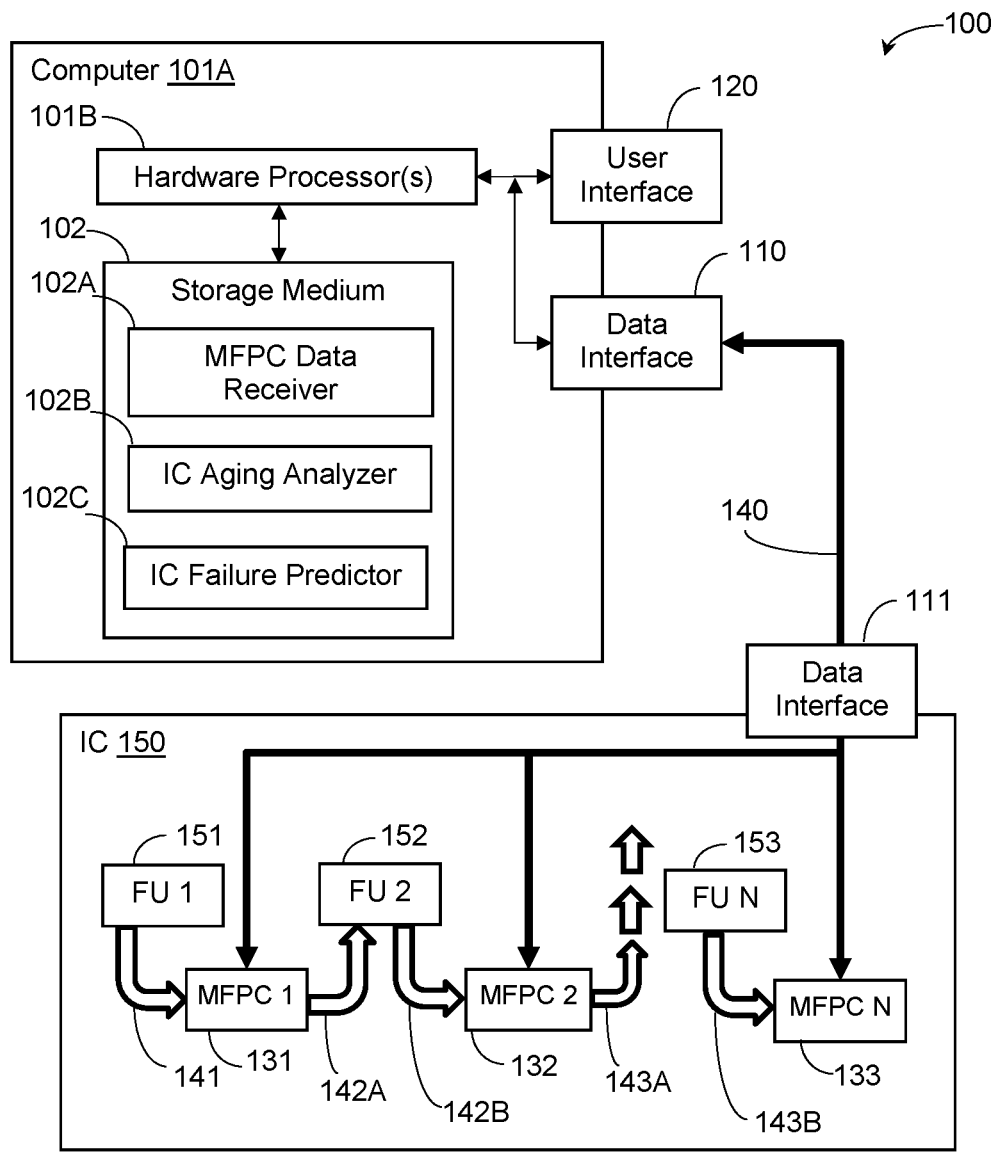
FIG. 1 shows schematically a computerized system for IC margin measurement and failure prediction.

Disclosed herein are methods and devices for determining and predicting a future failure of the individual integrated circuit. Also disclosed is a timing delay margin measurement circuit for an IC, from its first operation and/or over time (for example, during any time period from or subsequent to its first operation). A dedicated circuit (which may be detector), such as a failure prediction circuit (FPC) or a margin measurement and failure prediction circuit (MFPC), is placed at selected points along one or more data-paths in a digital integrated circuit (such as one or more FPC or MFPC per data-path), where each dedicated circuit combines multiple individual data paths into a fewer number of test paths. By splitting each test signal into two, and applying a delay circuit to one of the split signal paths, a fingerprint or signature of the delays of each path of the data-path may be acquired during each clock cycle of the functional unit. As used herein, the term "fingerprint" and/or "signature" mean the profile of signal strengths, such as a vector, series, and/or the like, resulting from a measurement of timing delay margins of a combination of signals of a data-path. For each clock cycle of the functional unit the output data-path may have a different data value. Thus, during each clock cycle, a different combination of the logical paths within the functional unit may be tested, producing a different fingerprint. By collecting a large number of fingerprints over time, a dataset of fingerprints may be analyzed. The analysis of the fingerprint datasets may determine the performance and/or predict future failure of the individual IC.

In general terms, there may be considered a semiconductor integrated circuit (IC) comprising: a signal path combiner, comprising a plurality of input paths (for example to receive signals on a data source or data-path, from a memory circuit and/or from logic circuits grouped by a clock enable) and an output, the output being based on a combination of respective signals received on each of the input paths; a delay circuit having an input electrically connected to the signal path combiner output, the delay circuit delaying an input signal by a variable delay time to output a delayed signal; and a comparison circuit arranged to provide a comparison output based on a comparison of the signal path combiner output and the delayed signal, wherein the comparison output is provided in a comparison data signal to at least one mitigation circuit. The combination of the signal path combiner, delay circuit and comparison circuit may provide an FPC or MFPC.

A method for using such an IC may also be considered (in which using may comprise one of more of operating, analyzing and configuring, for instance). For instance, this may include a method for using a semiconductor integrated circuit (IC). The method may comprise: combining respective signals received on each of a plurality of input paths at a signal path combiner to provide an output; delaying the signal path combiner output by a variable delay time at a delay circuit to output a delayed signal; and comparing the signal path combiner output and the delayed signal to provide a comparison output and providing the comparison output in a comparison data signal to at least one mitigation circuit.

It may also be considered that the steps of combining, delaying and comparing may be repeated for each of a plurality of delay times. In this way, a plurality of comparison outputs may be provided. An identifying characteristic (i.e. a signature or fingerprint) for the IC may thereby be determined based on the plurality of comparison outputs. By repeating this process over different clock cycles, multiple such fingerprints may be determined. The fingerprints may then be tracked at different times, for example by tracking changes in the fingerprint over time (using intervals at least as long as the length of time taken to determine a single fingerprint and preferably longer).

Further optional method features corresponding with the steps implemented by any of the features described with reference to the IC may also be provided. Examples of these may be discussed below. Specific embodiments will also be discussed below, but further reference will also be made to generalized senses or terms of the disclosure.

Note that a data-path is one example of a design style that can be handled by the FPC or MFPC, other examples may be memory circuits (the FPC/MFPC is located at the output of the memory) and other logic circuits that are grouped together with respect to a certain clock enable.

Optionally, aspects of embodiments described herein may be applied to any reliability problem of IC performance, such as aging, latent defects that manifest in the design and cause degradation, manufacturing differences within/between ICs, manufacturing differences between fabs, and/or the like. The techniques described may find changes in timing delays from any source or cause, predict a future failure before the IC failure causes a device/system failure, and enable corrective and preventive action before the specific IC failure. While reliability issues, such as aging, electro-migration, and/or the like, are used here as examples, the techniques may also be applied to latent defects, such as random defects, systematic defects, unknown defects, and/or the like.

Optionally, the delay me be changed in small time steps, producing one or more sweeps of time delays, and associated fingerprints at each different time delay. The sweep may be analyzed to determine the operation of the individual IC, predict a future failure of the IC, and/or the like.

Optionally, one or more datasets (e.g. from signals on the IC) may be analyzed combinatorically to determine the operational delays of each path of the data-path (or equivalent signal path), each logical processing path of the functional unit, and/or the like.

Optionally, one or more datasets may be analyzed statistically to predict a future failure the IC. For example, an IC degradation trend may be analyzed in one or more delay margins measured using the failure prediction circuit, such as be analyzing a minimum delay margin change over time.

Optionally, one or more datasets may be analyzed using machine learning to monitor the failure of the IC, predict a future failure of the IC, and/or the like.

Optionally, one or more datasets may be analyzed to design a future IC.

Optionally, one or more sweeps may be analyzed combinatorically to determine the operational delays of each path of the data-path, each logical processing path of the functional unit, and/or the like.

Optionally, one or more sweeps may be analyzed statistically to predict a future failure the IC. For example, a regression analysis of one or more sweeps determines the changes in timing delays, and an extrapolation to a timing delay failure value determines the time to failure.

Optionally, one or more sweeps may be analyzed using machine learning to monitor the failure of the IC, predict a future failure of the IC, and/or the like.

Optionally, one or more delay time sweeps may be analyzed to design a future IC, where the future IC is designed to avoid the failures of the previous ICs.

Optionally, one or more sweeps are analyzed using machine learning at the beginning-of-life of the chip, e.g. the timing delay margins signature or fingerprint of the IC at the beginning-of-life. The signature or fingerprint may be used for chip outlier detection/screening, i.e. a specific IC is given a unique identity and the signature as compared to other ICs that allows detecting anomaly's in a large manufacturing scale.

Figure 2:
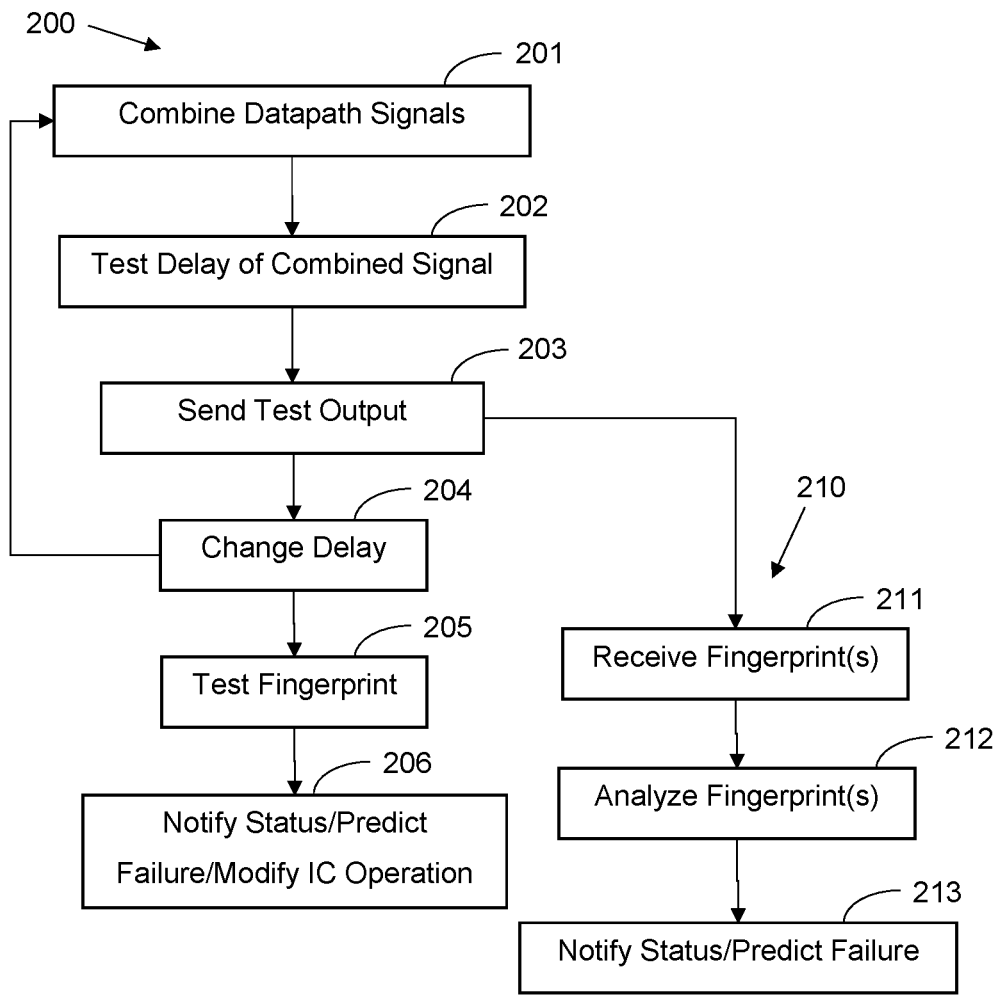
FIG. 2 shows flowcharts of methods for IC margin measurement and failure prediction.

Reference is now made to FIG. 1 and FIG. 2, which show schematically a computerized system 100 and flowcharts (200 and 210) of methods, respectively, for IC failure prediction and margin measurement of logic-paths at the IC testing (tester or system level). System 100 comprises an IC 150, a computer 101A, and a data interface connection 140 connecting the two. IC 150 comprises multiple function units (as at 151, 152, 153, and the like), and data-paths (as at 141, 142A, 142B, 143A, 143B, and the like, which may include synthesized logic) between them. IC 150 comprises margin measurement and failure prediction circuits (MFPCs; as at 131, 132, 133, and the like) for capturing signals from data-paths (as at 142A, 143A, and the like), and determining delay timings of at least some signals form the respective data-path. MFPCs 131, 132, or 133 combine 201 signals from the data-path, and test 202 one or more delays of the combined signals. IC 150 comprises a data interface for connecting to data interface connection 140, and sending 202 the delay timings to computer 101A. Delay timing data collected for multiple signals of the data-paths and/or for multiple delay values, such as be changing 204 the delay, may be considered the fingerprint of the delay timings.

Computer 101A comprises one or more hardware processors 101B, a user interface 120 and a non-transitory, computer readable storage medium 102. Storage medium comprises program code, such as an MFPC Data Receiver 102A, an IC Aging Analyzer 102B, an IC Failure Predictor 102C, and/or the like, the program code comprising instructions that when executed on hardware processor(s) 101B, cause hardware processor(s) 101B to receive 211 the signal delay data (i.e. fingerprints) using a data interface 110, such as using MFPC Data Receiver 102A. IC Aging Analyzer 102B analyzes 212 the fingerprints, and IC Failure Predictor 102C notifies 213 an operator of a status, a failure prediction, a preventative action, and or the like, such as using user interface 120.

Optionally, the delay timings are analyzed by a circuit (not shown) of IC 150 to determine when clock and/or logic modifications 206 on IC 150 improve the lifetime of IC 150 before failure. Optionally, the delay timings are analyzed by a circuit (not shown) of IC 150 and a notification 206 is issued of the status or failure prediction.

Optionally, the delay timing fingerprint may be generated at the IC testing (tester or system) to extract the time-zero margin map of the data-paths in a certain unit.

The fingerprint may be analyzed at a time of initial operation and monitored over the life of the IC to determine when a predicted failure may occur. For example, a defect degradation gradient analysis may determine the future time of a failure of the IC. For example, analyzing the minimum margin of a fingerprint, plotting the minimum margin over time, and extrapolating the plot to a margin delay of zero determines the predicted time of failure.

Figure 3:
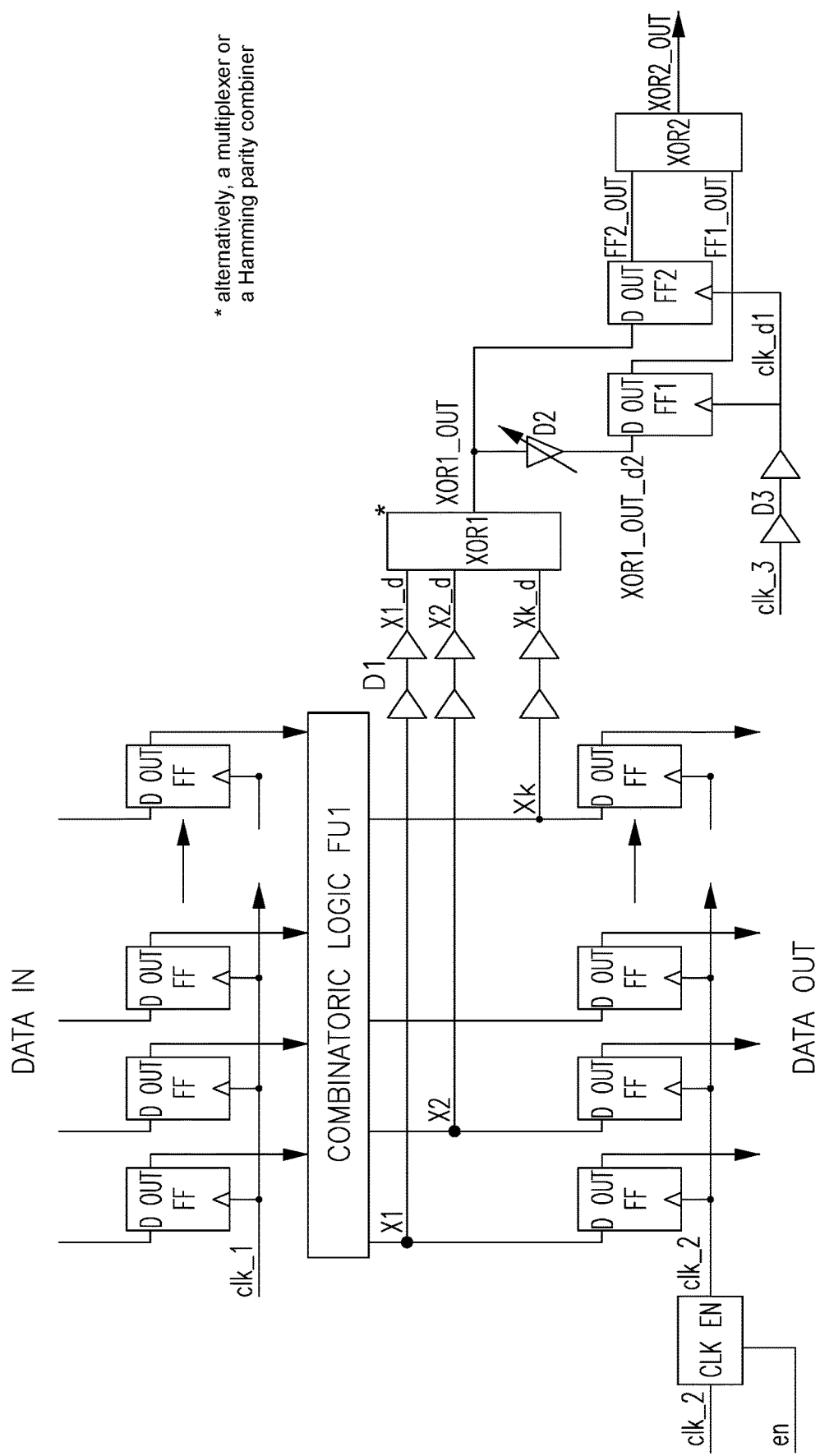
FIG. 3, FIG. 3A and FIG. 3B show respective XOR-based circuit diagrams for IC margin measurement and failure prediction.

Reference is now made to FIG. 3, which shows a XOR-based circuit diagram for IC failure prediction. An XOR component (XOR1) combines the signals from a data-path, such as 64, 128, 256, 512, or the like number of signals into a single signal XOR1_out. XOR1_out is fed into a first flip-flop FF2, and a delay line D2. The delayed XOR1_out is fed into a second flip-flop FF1. FF1 and FF2 are activated by a clock clk_3, and their outputs XOR combined with XOR2. XOR2_out is a logical 1 for each delay where one of XOR1_out and XOR1_out_d2 is logical 1 at time of clk_d1.

Thus, multiple instances of clk_d1 may and/or multiple values of D1 may determine timing delay data of the delay along data-paths of combinatorial (Combinatoric) logic FU1, and thus the fingerprint of timing delays. By analyzing these timing delays over time, the MFPC may detect which of the paths of FU1 is degrading and/or aging fastest, and may cause failure of IC 150.

The output signal of XOR1 may be considered a compression of the input signals that preserves the minimum timing margin delays of the input signals of the data-path. The output of XOR2 may be logic-1 when the minimum margin of an input signal is smaller than the delay associated with D2. Thus, XOR1 may be a parity checker, i.e. the output is logical 1 when the parity of the input signals is logical 1. Each rising-edge of the compressed signal (XOR1 output) may be associated with a rising edge of one of the input signals. For the simple case in which the minimal timing delay margin is associated with only one input, the last rising or falling transitions of XOR1-output represents the minimal margin. This concept may be proven by a mathematical proof, described hereinbelow, as well as by event-based simulations. For example, special cases may be proved by simulation, where the margin of several signals is smaller than D2, multiple signals switched simultaneously, and/or the like.

In the general terms considered above, the IC may further comprise: a first internal storage circuit, electrically connected to the signal path combiner output and arranged to provide the stored signal path combiner output as a first input to the comparison circuit; and a second internal storage circuit, electrically connected to the delayed signal and arranged to provide the delayed signal as a second input to the comparison circuit. However, such a configuration is optional, as will now be discussed.

Figure 3A:
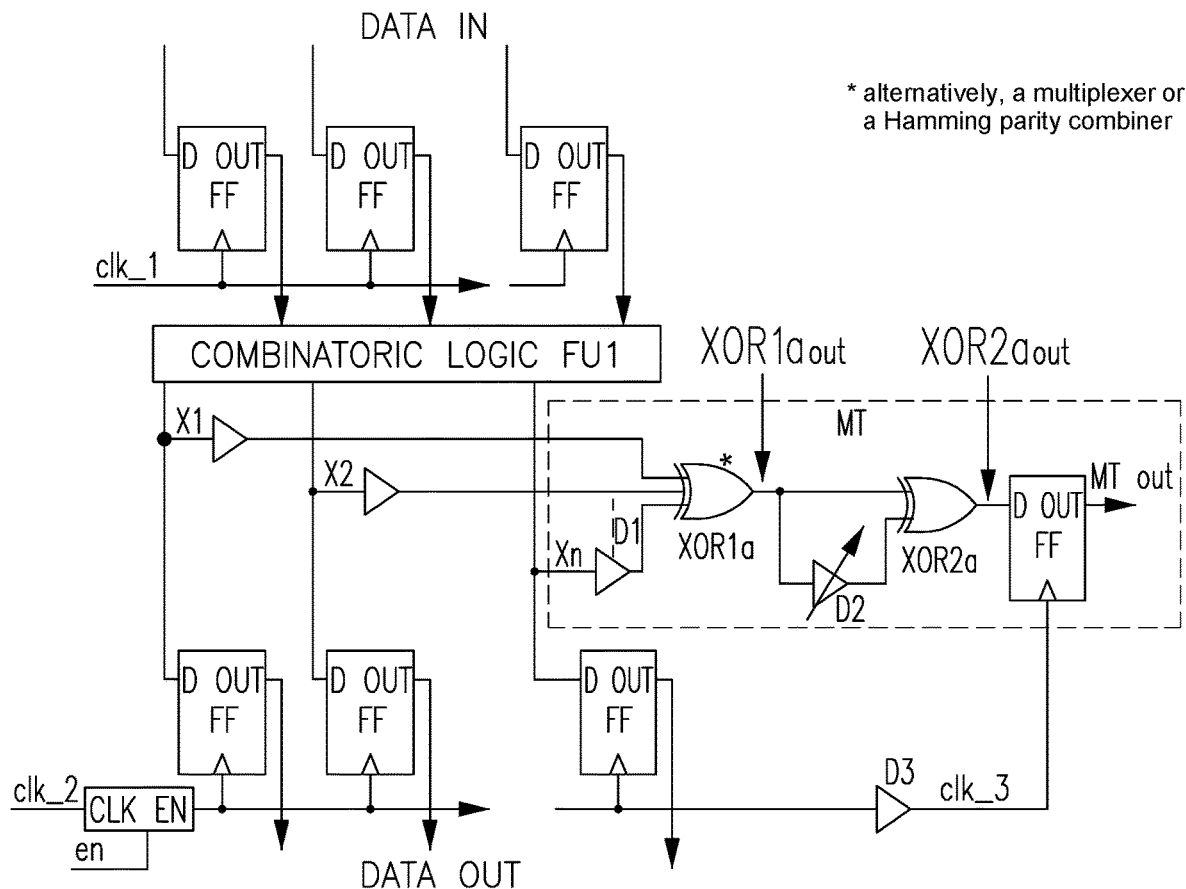

Reference is now made to FIG. 3A, which shows a different version of a XOR-based circuit diagram for IC failure prediction, in comparison with that shown in FIG. 3. The data-path shown in FIG. 3A has essentially the same structure as that shown in FIG. 3. In this version, a XOR component XOR1a combines the signals from the data-path, such as 64, 128, 256, 512, or the like number of signals, into a single output signal, $XOR1a_{out}$. $XOR1a_{out}$ is fed as a first a first input to a second XOR circuit XOR2a and in parallel, to a delay-line D2, the output of which provides a second input to the second XOR circuit XOR2a. The delayed output signal from the second XOR circuit XOR2a, $XOR2a_{out}$, is fed into a flip-flop FF1b. Flip-flop FF1b is activated by a clock (clk1a). The second output signal $XOR2a_{out}$ is a logical 1 for each delay where the two inputs of the second XOR circuit XOR2a are at different logic state at time of clk1a.

Figure 3B:
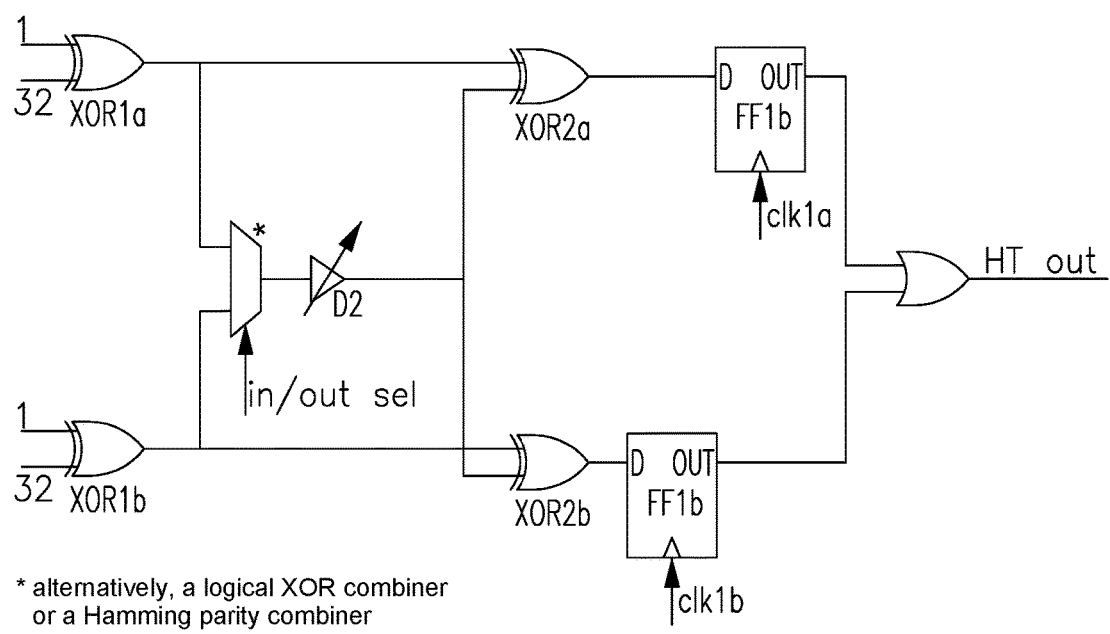

Reference now is made to FIG. 3B, which shows a further different version of a XOR-based circuit diagram for IC failure prediction, in comparison with that shown in FIG. 3. In this version, two XOR-based failure prediction circuits are provided that use one delay-line circuit. In other words, two data-paths are provided, each of which may be in accordance with that shown in FIG. 3 or FIG. 3A. The first failure prediction circuit comprises: a first XOR component XOR1a that is driven by a set of parallel-input signals from a first data-path (as discussed with reference to FIG. 3 or FIG. 3A above); a second XOR component XOR2a; and a first flip-flop FF1b that is clocked by a first clock signal clk1a. The second failure prediction circuit comprises: a third XOR component XOR1b that is driven by a set of parallel-input signals from a second data-path (as discussed with reference to FIG. 3 or FIG. 3A above); a fourth XOR component XOR2b; and a second flip-flop FF1b that is clocked by a second clock signal clk1b. A common delay-line D2 serves the two failure prediction circuits with a multiplexer mux selecting, in a time-sharing mode, whether the output of the first XOR component XOR1a or the output of the third XOR component XOR1b is provided as an input to the common delay-line D2. This is controlled using a selection signal In/out sel. The configuration of each of the two failure prediction circuits is otherwise as shown in FIG. 3A. The output of the first flip-flop FF1b clocked by first clock signal clk1a and the output of the second flip-flop FF1b clocked by second clock signal clk1b are provided as inputs to an OR gate to generate an output signal MT-out. When the multiplexer mux connects the output of the first XOR component XOR1a to the input of the delay-line D2, output signal MT-out is a logical 1 for each delay where the two inputs of the second XOR component XOR2a are at different logic state at time of the first clock signal clk1a. When the multiplexer mux connects the output of the third XOR component XOR1b to the input of the delay-line D2, output signal MT-out is a logical 1 for each delay where the two inputs of the fourth XOR component XOR2b are at different logic state at time of second clock signal clk1b.

In general terms, it may be further considered that the signal path combiner is a first signal path combiner arranged to receive a plurality of signals from a first data source (which may be a data-path or other set of signals as discussed herein) and the comparison circuit is a first comparison circuit. Then, the IC may be considered to further comprise a second signal path combiner, comprising a plurality of input paths and an output, the second signal path combiner output being based on a combination of respective signals received on each of the input paths, the signals being received from a second data source. Then, a multiplexer may be provided, configured to receive the first signal path combiner output, the second signal path combiner output and to selectively output the first signal path combiner output or the second signal path combiner output based on a received selection signal. The output of the multiplexer may be provided as the input to the delay circuit (such that the delay circuit is common to both the first and second signal path combiners. The IC may further comprise a second comparison circuit arranged to provide a second comparison output based on a comparison of the second signal path combiner output and the delayed signal (which may thereby be common to both the first and second comparison circuits). An OR gate may further be arranged to receive as inputs the first comparison output and the second comparison output and to provide an output as the comparison data signal to the at least one mitigation circuit. With reference to the method aspect, this may further comprise: combining respective signals received on each of a plurality of input paths at a second signal path combiner to provide an output, the signals being received from a second data source; receiving the first signal path combiner output, the second signal path combiner output and a selection signal at a multiplexer and selectively outputting the first signal path combiner output or the second signal path combiner output based on the selection signal, the output of the multiplexer being provided as the input to the delay circuit such that the step of delaying comprises delaying the first signal path combiner output or the second signal path combiner output by the variable delay time at the delay circuit to output the delayed signal; comparing the second signal path combiner output and the delayed signal to provide a second comparison output; and receiving at an OR gate, the first comparison output and the second comparison output as inputs and outputting the comparison data signal as an output from the OR gate to the at least one mitigation circuit.

Optionally, a first comparison storage circuit, controlled by a first clock signal, may be arranged to receive the first comparison output. Then, a second comparison storage circuit, controlled by a second clock signal (which may be the same or different from the first clock signal) may be arranged to receive the second comparison output. The first comparison storage circuit is advantageously arranged to provide the first comparison output as a first input to the OR gate and the second comparison storage circuit is arranged to provide the second comparison output as a second input to the OR gate.

Figure 4:
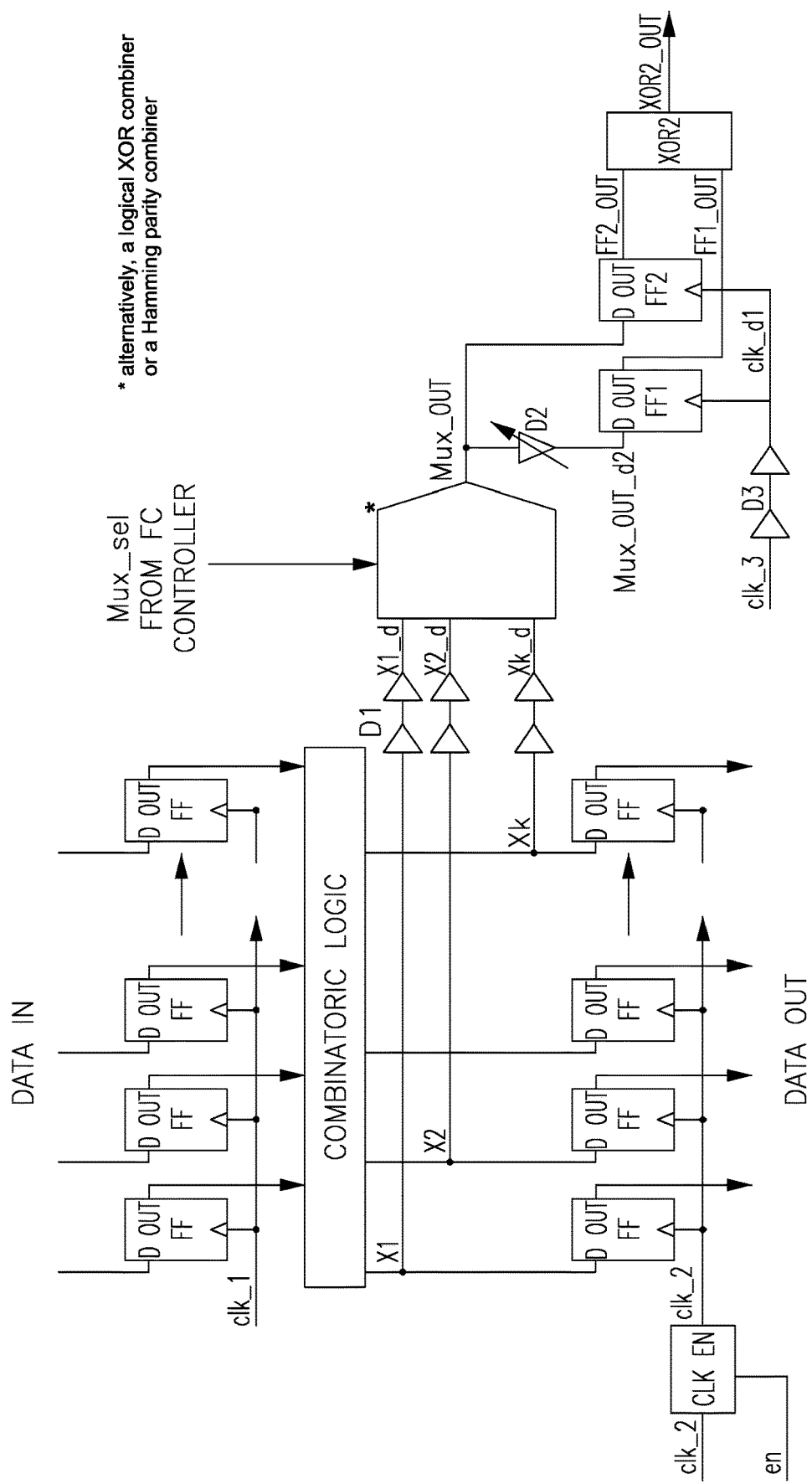
FIG. 4 shows a MUX-based circuit diagram for IC margin measurement and failure prediction.

Reference is now made to FIG. 4, which shows a MUX-based circuit diagram for IC failure prediction. A multiplexer (Mux_sel) is used to select one or more of the data-paths, and then detect a delay timing fingerprint as described herein. The advantage with the MUX-based MFPC is that the one signal is selected for delay timing at a time, so failure may be detected with less data (such as with a dedicated analysis circuit on the IC). Optionally, a hybrid MUX/XOR based MFPC may be used that combine some of the advantages from each type of MFPC.

Figure 5:
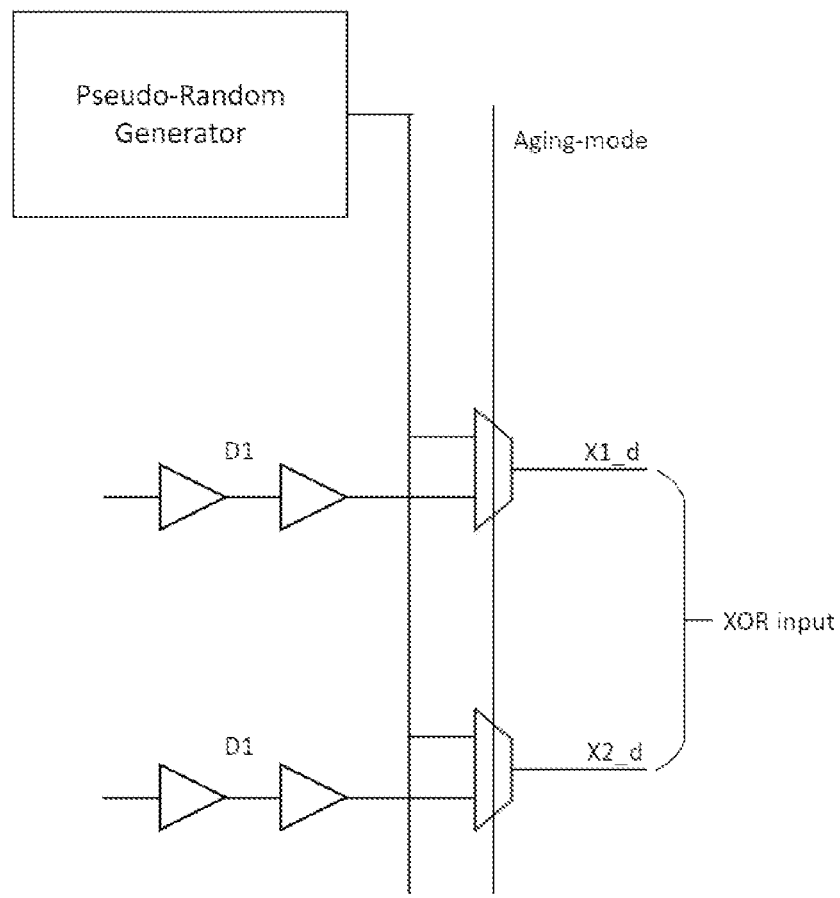
FIG. 5 shows a circuit diagram for anti-IC aging mode.

Reference is now made to FIG. 5, which shows a circuit diagram for anti-IC aging mode. The figure shows an anti-aging technique that deactivates the XOR circuit when the MFPC circuit is not enabled i.e. the MFPC clock is gated. When the circuit is disabled, a constant logic delay will increase the circuit degradation, such as due to NBTI effects. To mitigate the NBTI degradation the XOR circuit is toggled whenever the MFPC clock is gated. Alternatively, each of the signals is monitored separately for margin degradation. FIG. 5 is just one example of alternative embodiments of circuit corrections that may be performed to compensate for the degradation and/or aging of the IC circuit. Many other example circuits may be used.

The techniques disclosed herein may be expand to other types of logic paths/signals, path lengths, and different types of generating and sampling electronic elements. For example, phase paths, latch-based logic paths, gated-clock logic paths, flip-flop (FF) fall timing logic signals, and/or the like. For example, embodiments may detect hold-failure (min-delay) that is caused by a delay degradation in the clock path. In this example, a new delay-path (such as D4) is located between the clock of FF1 and FF2 such that the D4 delay value delays the clock of FF2.

The MFPC may be always on or activated by an enable signal. For example, an enable signal represents a logical OR of the enable signals corresponding to the group of FFs that are sampled by the MFPC. When the enable is low, the MFPC may enter into an anti-IC aging mode detection, where a dedicated clock is used to toggle the MFPC to mitigate NBTI aging effects.

When the MFPC covers large logic areas (FUs) of the IC, the MFPC may be used as a timing delay margin signature or fingerprint of the IC at first operation. Over time, the MFPC may measure the margin signature at different times to analyze and detect the time gradient of the IC degradation/aging. Different gradient functions may be related to different types of defects and degradation modes.

Optionally, the signature comprises multiple, overlapping delay margins, and a several critical timing delay margins are identified as having different time gradients each, and each is separately analyzed to predict a future IC failure. For example, non-linear, spatiotemporal correlation methods are used to track multiple timing delay margins simultaneously from a series of signatures or fingerprints, each signature or fingerprint representing a one-dimensional vector of all timing delays overlapped. For example, a transformation is performed of multiple one-dimensional vectors to produce a two or more-dimensional data representation. For example, Laube et al. published in 2002, "Analyzing Relative Motion within Groups of Trackable Moving Point Objects", in Lecture Notes in Computer Science (Egenhofer et al.— editors—Geographic Information Science, GIScience 2002), vol. 2478 (Springer, Berlin, Heidelberg), pages 132-144, which is incorporated entirely by reference.

When the performance of semiconductor integrated circuits is degraded over time, the progression of physical defects may gradually increase the delay time of the IC's circuits. The IC may fail when the delay time exceeds the IC's clock cycle time. Existing defect detection techniques may be able to detect defects after failure occurs, but when eminent failure is predicted, preemptive maintenance may be performed. This is especially important to applications where cost of failure is high (such as autonomous vehicles), cost of replacement is high (such as satellite IC failure), cost of failure to product image is high (such as a resulting negative user experience is created by failure), and/or the like. An integrated circuit (IC) embodiment using the techniques disclosed herein, includes a failure prediction circuit and a system that may alert of an imminent failure before the failure occurs.

For example, in the generalized sense discussed above, the variable delay time may be set in an integer multiple of increments equal to a clock period of the IC divided by a factor (a "signature vector size"), which is preferably from 1 to 100,000.

In some embodiments, the failure prediction circuit is comprised of a pair of storage components (e.g., flip-flops) that both receive a data signal output from a large number of paths of the IC, such as a data-path, memory paths, logic paths, and/or the like. To reduce overhead, the data signal is reduced using Hamming codes, parity codes, other error-correction techniques, and/or the like, before being stored in the two storage components. The two storage components differ from each other in data signal input timings, clock signal input timings, phase of input signals, input logic thresholds of the data signal, and/or the like. For example, a variable timing circuit is used to delay the signal to one of the flip-flops.

The FPC or MFPC further includes electronic components that determine (a) coincidence or non-coincidence of the outputs from the two storage components, and (b) how close the delay between non-coinciding outputs is to the clock cycle time of the IC.

In operation, after the coincidence or non-coincidence of the signal outputs is determined (such as using an XOR component), the failure prediction circuit increments the input timing, clock signal input timing, or input logic thresholds of one of the storage components, and the coincidence or non-coincidence of the outputs is determined again. This cycle may be repeated with small increments.

A log is maintained of the relative length of the sensed delay in comparison to the clock cycle time, as well as of the storage components increment used. Analysis, such as trend detection, combinatorial analysis, machine learning, regression analysis, anomaly detection, and/or the like, may be performed on the logged data, to estimate when the ICs degradation may reach a time when the IC fails, such as when the shortest logical path delay exceeds the subsequent clock cycle time.

This measurement and/or estimation may be utilized in a number of ways. An alert may be issued to the user of the system where the IC is implemented, indicating either the margin (how close the delay is to the IC's clock cycle time) or the estimated failure time. Further, the agent may instruct an operational change of the IC, such as clock speed or voltage reduction, which may postpone the failure and prolong the IC's lifespan.

By continuously monitoring logic circuits at the data-path output using a small number of components, resources, such as IC area, power, and/or the like, may be conserved relative to existing techniques.

For example, the input signals are compressed to generate a Hamming code (compressed into the Hamming space). The Hamming-code may be used for higher-order of error detection, correction, and/or prediction process. For example, an XOR-based circuit is used to combine all data-path signals into two unified signal path that implements a modulo-4 logic operation. Other types of compression (source) code may be used additionally or as an alternative.

In the general terms discussed previously, it may be understood that the signal path combiner (or at least one of the signal path combiners) comprises at least one of a logical XOR combiner (as shown in FIG. 3 or FIG. 3A), a Hamming parity combiner, and a multiplexer.

The technique may be expanded to other types of logic-paths and sampling sequential elements, for example:
 Phase paths
 Latch-based logic paths
 Gated-clock logic paths
 Data-path signal fall based logic paths
 Memories inputs & outputs
The failure prediction circuit may be always on or may be activated by an enable signal that represents a logic-OR of the signals of a data-path. When the enable is low, the failure prediction circuit uses a dedicated clock to toggle the circuit to mitigate aging effects.

Integrated circuits may implement a large number of synchronous and timing sensitive logic circuits. When the delay of the circuit is increased due to physical degradation, then a timing violation occurs, and the violation may affect the functionality of the circuit. The physical degradation may be caused by aging effects, or due to defects that developed during use. The failure prediction circuit tracks the logic delay margin over time, and may predict a failure due to physical delay degradation.

In the general terms discussed above, it may therefore be considered that the mitigation circuit is at least one circuit from the group consisting of: a notification circuit (for example, as configured to produce notification 206 or 213); a timing delay measurement (or estimation) circuit (for example, for providing a timing delay output); a data transmission circuit; an IC anti-aging compensation circuit (for instance, as discussed with reference to FIG. 5 above); and a failure analysis circuit.

Where the mitigation circuit is a data transmission circuit, it may be electronically connected to a computerized server. Then, the computerized server is advantageously configured to receive multiple instances of the comparison data signal (for example in respect of different times and/or different data sources). The computerized server may thereby perform a failure prediction analysis of the comparison data signals. Optionally, it may send a notification to a mitigation module (such as an IC anti-aging compensation circuit) when the failure prediction analysis predicts failure of the IC within a predefined time. At least some of the comparison data signals may be generated at multiple values of the variable delay time and/or at least some of the comparison data signals may be generated from multiple instances of at least one value from multiple values of the variable delay time. Optionally, the failure prediction analysis comprises at least one of a machine learning analysis, a trend analysis, a multiple object tracking analysis, and a multivariant analysis. Advantageously, the failure prediction analysis comprises receiving comparison data signals and/or failure prediction analysis results from multiple different ICs.

The failure prediction circuit beneficially continuously monitors a large number of logic circuits, such as signals of a data-path on the output of a functional unit of an IC, using small IC area and power.

In some embodiments, a computer algorithm may be used to determine the population of the failure prediction circuits within a unit per a pre-defined coverage. It may use design-data such as memory-circuits and flip-flop-circuits within the unit. The computer algorithm may also be used to automatically locate the FPC or MFPC circuits per the unit clock-gate signals and to automatically set the input-signal-size per FPC or MFPC for optimal performance (maximum instance coverage with minimum number of FPC or MFPC circuits).

In some embodiments, the delays within the failure prediction circuit may be calibrated. This may be done in order to have a very fast correlation path to the design data and to provide accurate margin results at time zero (during test). One calibration methodology may use Pre-Si estimator functions that are based on on-die sensors (agents) in Post-Si to translate the FPC or MFPC circuit measured margin in Pre-Si to the worst case margin of the monitored endpoints (FFs) margins.

In general terms, this may be considered to include measuring or estimating a timing delay for the IC (particularly at initial or time-zero operation), based on the comparison data signal provided to the mitigation circuit. The timing delay may be based on a plurality of comparison outputs (which may be in a single comparison data signal or a plurality of comparison data signals), for example determined by repeating the steps of combining, delaying and comparing for each of a plurality of delay times.

In some embodiments the delay through X1 . . . Xn+Xor1A+Xor2A is balanced to a delay applied to the clock used for the output flip-flop (D3) in order to make the calibration shift minimal.

Figure 11:
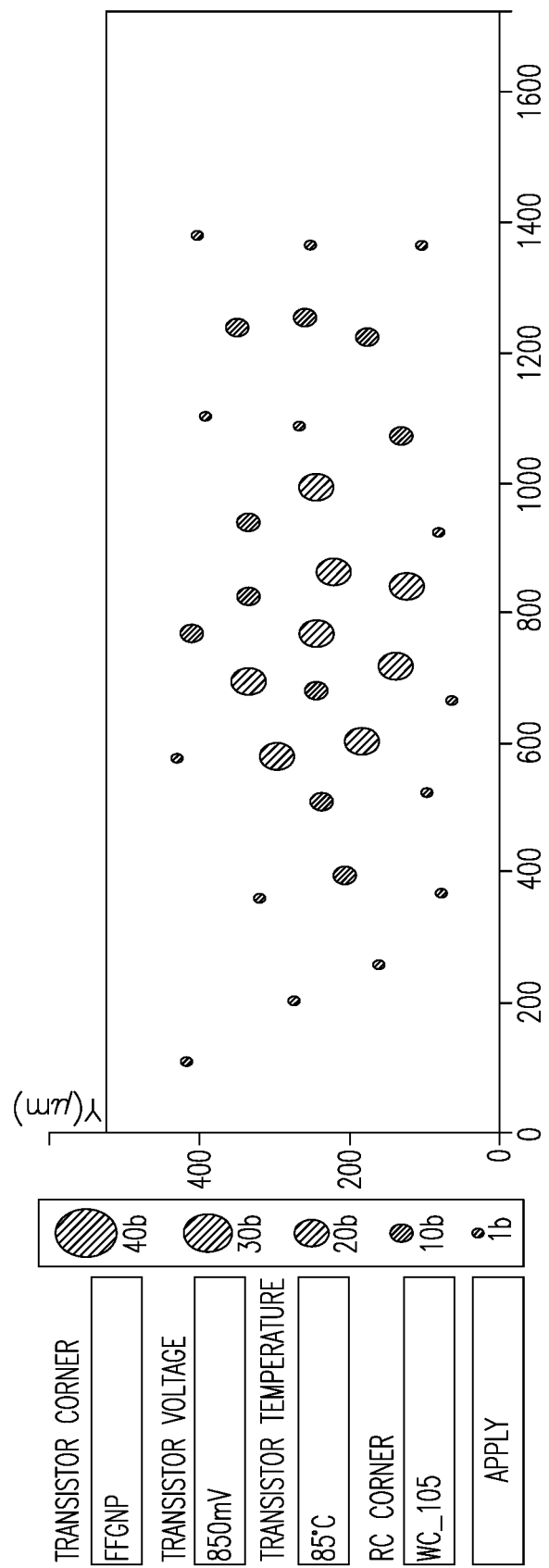
FIG. 11 shows a Margin-Map diagram of a unit.

In some embodiments, the timing margin data of a large-scale logic circuit within a unit or a die that was extracted at time-zero, such as digital logic circuits and/or the like, may be tracked and compared over time. The tracking may detect and/or predict a timing failure due to change in the delay and/or aging degradation of the IC. Referring now to FIG. 11, there is shown shows a Margin-Map diagram of a unit. This is an example of a unit margin map that represents the unit margin finger-print at the beginning of life (the margin is represented by an equivalent buffer-delay). The signature may be used for chip outlier detection/screening. In other words, a specific IC is given a unique identity and the signature is compared to other ICs, which allows detecting anomalies in a large manufacturing scale. The margin-map can be tracked over time to measure the margin signature at different times to analyze and detect the time gradient of the IC degradation or aging. Different gradient functions may be related to different types of defects and degradation modes.

In some embodiments, the margin data of a die can be collected and used for die-classification and anomaly-detection processes. This is done by collecting the margin data of a unit within a die and use ML algorithms to build an estimator function that are based on on-die sensors. More details are described in U.S. provisional patent application No. 62/675,986 entitled "INTEGRATED CIRCUIT PROFILING AND ANOMALY DETECTION", filed Apr. 16, 2018, whose contents were effectively published in the framework of U.S. Patent Application Publication No. 2021/0173007 on Jun. 10, 2021, the contents of which incorporated herein by reference in their entirety.

In some embodiments, the margin data can be analyzed per a specific running application to generate an application-based frequency/power binning.

Following are mathematical proofs that may rely on an assumption that all paths are independent. For simplicity, the proof is performed using the circuit described in FIG. 3. The proof is also valid for the circuit describe in FIG. 3A under the assumption that XOR2a is symmetrical. This assumption may be relaxed in cases of at least some dependent paths when needed, with appropriate amendments. At any time, denoted t, we denote the margin of path $x_i^t$ (path i at time t) by $m_i^t$. In the following, the clock cycle is denoted by T.

Theorem 1: At time t,

A.

For $D2 < \min_{1 \le i \le k} m_i^t = m_{min}^t$, the output of $XOR2$ is constantly $0'$

B.

For $D2 > m_{min}^t$, the output of $XOR2$ may be $1'$ with some probability $P$.

Theorem 2: For the second case of theorem 1 ($D2>m_{min}^t$), the probability P is larger $$\text{than } \max_{j \in K^*} 2q_j(1-q_j), \text{ where } K^* = \{j > 0 | D2 > m_j^t\}.$$

Corollary: Given that by some degradation $m_{min}^{t_1} > m_{min}^{t_2}$, where $t_2 > t_1$. Then, for D2 such that $m_{min}^{t_1} > D2 > m_{min}^{t_2}$, the output of XOR2 is 0' on time $t_1$ and 1' with some probability on $t_2$.

Proof of Theorem 1:
Case A: As all the inputs of XOR1 do not change at the time window ($T-m_{min}^t$, T] it follows that FF1 and FF2 contain the same value, so the output of XOR2 is 0'.
Case B: We represent XOR1 by 3 XORs: XORa, XORb and XORc. Their inputs are as follows:
  XORa: a constant 0', plus all the paths i for which $m_i^t < D2$.
  XORb: a constant 0', plus all the paths i for which $m_i^t > D2$.
  XORc: the outputs of XORa and XORb.
Then, at the time window [$T-D_2$, T],
  The output of XORa may be changed with some probability, as the inputs may be changed during that time.
  The output of XORb is constant.
Therefore, the output of XORc, (which is actually the output of XOR1) may be changed at the time window (T–D2, T] with some probability, and hence the output of XOR2 may be 1'.

Proof of Theorem 2:
Let's use the same representation of XOR1 as in the proof of Theorem 1. Then, the probability P in which the output of XOR2 is 1' is the probability in which the output of XORa is changed in two sequential cycles. That probability is $2q_{out}(1-q_{out})$ where $q_{out}$ is the probability that the output of XORa is 0'.
Now, let represent XORa by 2 XORs: XORa1 and XORa2. Their inputs are as follows:
  XORa1: The signal x for which $q_x(1-q_x)$ is the maximal among all the inputs of XORa and the output of XORa2. Note that the output of XORa1 is actually the output of XORa.
  XORa2: all the inputs of XORa except of the signal x (for which $q_x(1-q_x)$ is the maximal).
Then, by Lemma 1 it follows that $q_{a1}(1-q_{a1})$, (where $q_{a1}$ is the probability that the output of XORa1 is 0') is larger than $q_x(1-q_x)$.
Hence as the output of XORa1 is actually the output of XORa, Theorem 2 is obtained.
Lemma 1: Let a and b stand for signals for which the probabilities for 0' are $q_a$ and $q_b$, respectively. Then, $q_c(1-q_c) \geq \max q_a(1-q_a), q_b(1-q_b)$, where $q_c$ stands for the probability that the output of XOR(a, b) is 0'.
Proof of Lemma 1:
Let's assume without loss of generality that $q_a(1-q_a) = \max q_a(1-q_a), q_b(1-q_b)$. Then, by simple algebra it follows that $q_a(1-q_a) = \frac{1}{4}(1-\Delta_a^2)$, where $\Delta_a = 1-2q_a$.
Furthermore, by the XOR definition it follows that: $q_c = q_a q_b + (1-q_a)(1-q_b)$. Hence, by the above algebra it follows that $q_c(1-q_c) = \frac{1}{4}(1-\Delta_c^2)$, where $\Delta_c = 1-2q_c$.
In addition, by the definition of $q_c$, it may be shown that $$\Delta_c = 1-2(2q_a q_b - q_a - q_b + 1) = 1-4q_a q_b + 2q_a + 2q_b = \Delta_a(-1+2q_b)$$

Hence, since $|-1+2q_b| \leq 1$, it follows that $\Delta_c^2 \leq \Delta_a^2$. So, Lemma 1 is obtained.
At any time-interval, the MUX-based MFPC may be considered a special case of the XOR-based MFPC. Hence the mathematical proof below of the XOR-based version holds for the MUX-based version.

EXPERIMENTAL RESULTS

Figure 6:
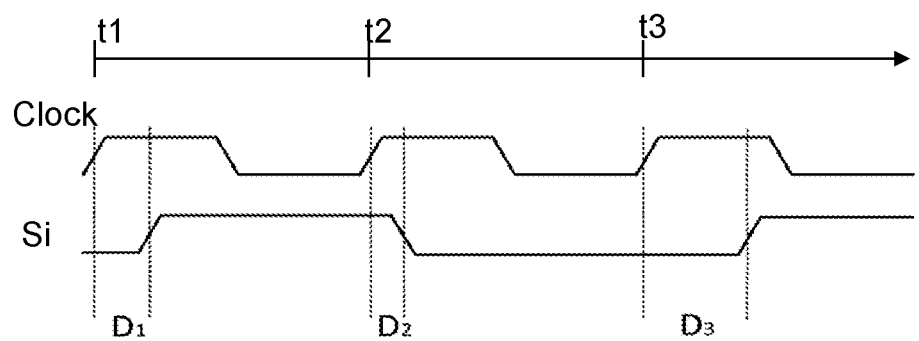
FIG. 6 shows a timing diagram of a signal delay for IC margin measurement and failure prediction.

Following are the results of simulation experiments.
Reference is now made to FIG. 6, which shows a timing diagram of a signal delay for IC failure prediction. Signal definition may be Di~U(Xi, Xi+di), and P{V(Si)=1, tj}=P{V(Si)=0, tj}=1/2. FIG. 6 shows an event-based simulation description, with simulation settings:
  XOR1 was monitoring 256 input paths
  The data length of each path was $10^4$ clock cycles
  The cycle time of the clock was defined as 100 units of time
  A signal Si was generated for each path [i] (detailed description in next page)
  Each path [i], was defined by two constants [Xi] and [di] which determine the delay per each clock cycle
  [Xi] was drawn for each path by a uniform distribution between 25-50 units of time
  [di] was drawn for each path by a uniform distribution between 0-25 units of time
  For signal i, the switching time in each cycle was uniformly drawn in the range of (Xi, Xi+di)
  The margin of signal i, is then [100-Xi-di]
  The experiment was conducted for each value of D2, where D2 was defined in units of time, and the D2 delay value was swept in values at a resolution of needed to resolve separate timing delay margins in the signature, such as resolutions of fractions of the clock period times. For each D2 value, XOR2 output transitions may be counted, and the number of counts is plotted vs. the margin timing value threshold. The X-axis margin threshold may be 100-D2, and the Y-axis may be the number of [1]'s at the output of XOR2 observed for a certain value of D2:

$$XOR2=1 \textit{ iff } XOR1(t=100) \neq XOR1(t=D2).$$

Figure 7:
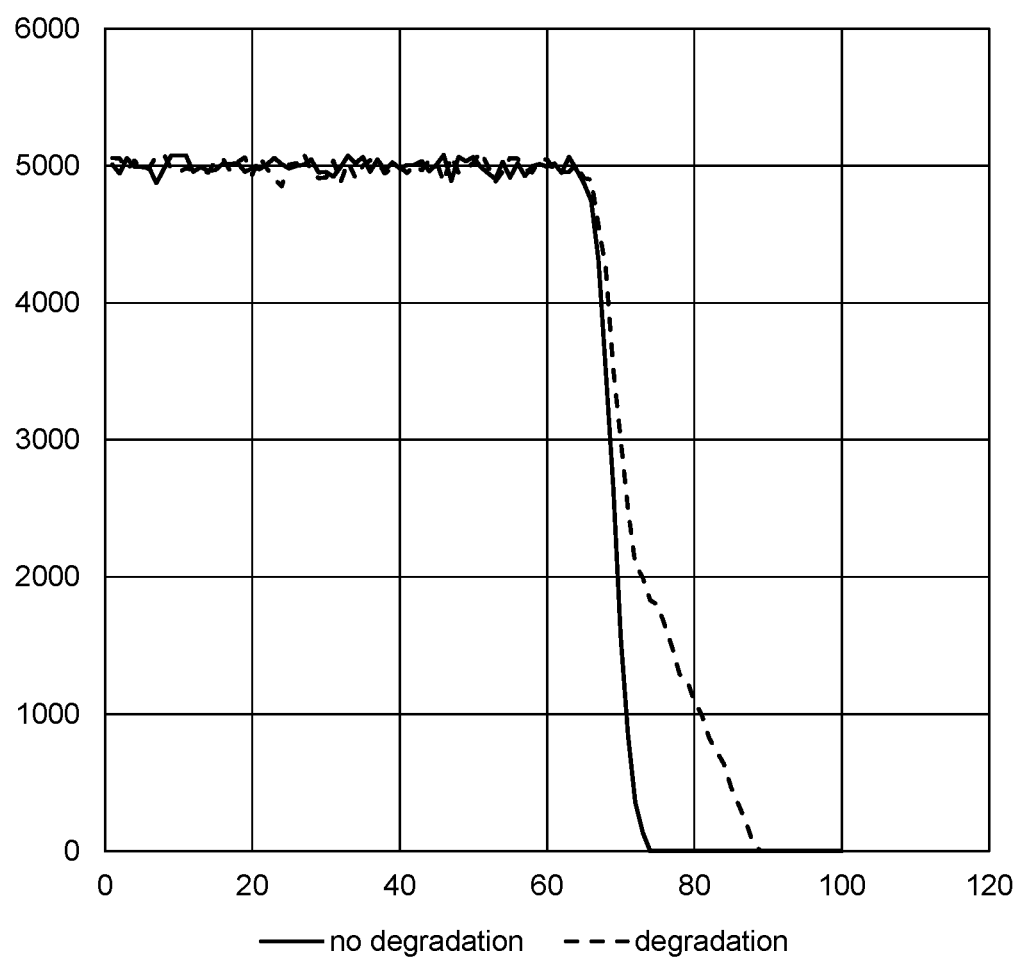
FIG. 7 shows a graph of errors versus cycle time for a first experiment.

Reference is now made to FIG. 7, which shows a graph of errors versus cycle time for a first experiment. The solid line represents the MFPC output at time-zero (without degradation), and the dashed line represents the MFPC output after degradation. The minimum margin was equal to 25 time-units, such as [100-75], and MaxD2 at failure was 75 time-units. In the degradation scenario the margin of one path was reduced by 15 time units (margin is distributed uniformly, and the max value was moved by 15 time units), the MFPC detects the change in the margin. Here the minimum margin was equal to 10 time-units, such as [100-75-15], and MaxD2 at failure was 90 time-units. The graph shows the counts at XOR2 output are gradually reduced to zero. For each D2 in the range of [75-90]:

$$P(XOR2=1)=P(\text{change,delay}>D2)=0.5*(90-(100-D2))/(di+15).$$

Figure 8:
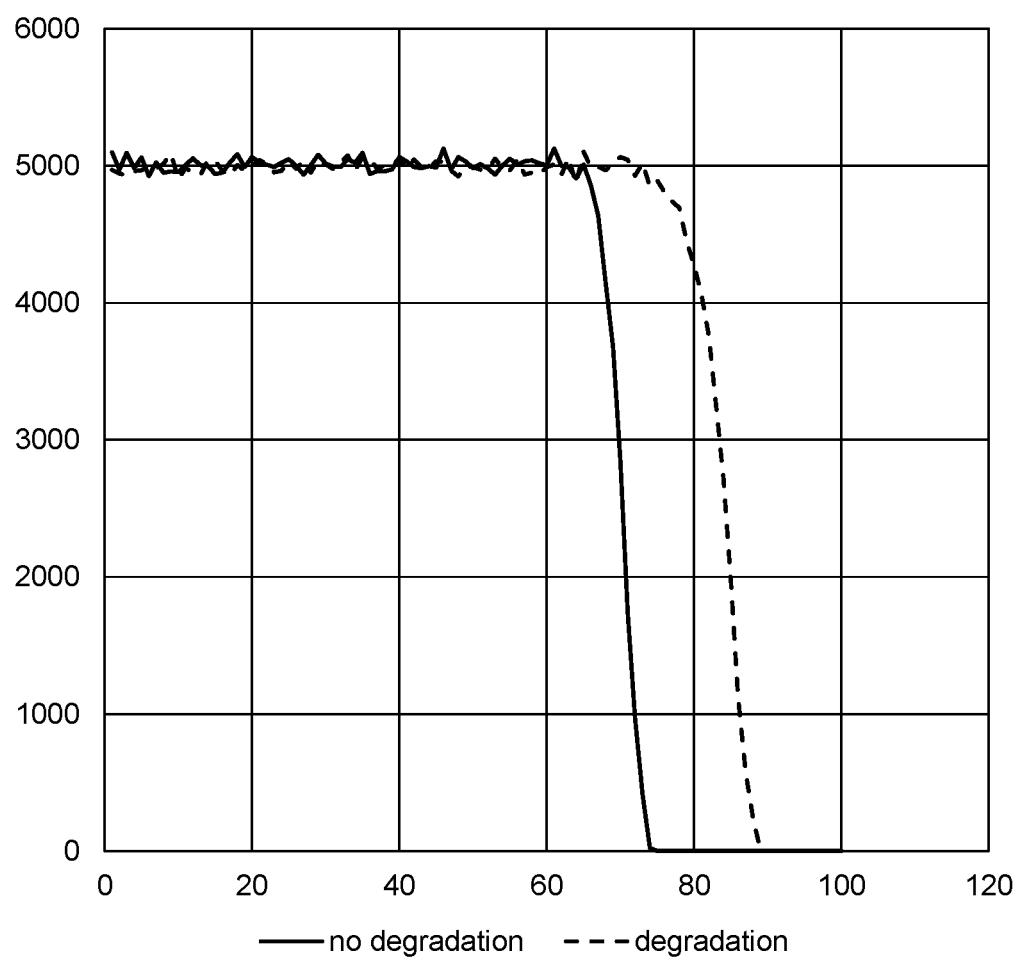
FIG. 8 shows a graph of errors versus cycle time for a second experiment.

Reference is now made to FIG. 8, which shows a graph of errors versus cycle time for a second experiment. The solid line represents the MFPC output at time-zero (no degradation), and the dashed line represent the MFPC output after degradation. The minimum margin of all the paths with [Xi+di>70] (margin<30) was increased by 15 time-units, and this was performed for 5 signal paths. The minimum margin was equal to 25 time-units, such as [100-75], and MaxD2 at failure was 75 time-units. The MFPC detects the change in the margin, where the minimum margin was equal to 10 time-units, such as [100-75-15], and MaxD2 at failure was 90 time-units. The counts at XOR2 output are gradually reduced to zero. The probability of failure was increased with the number of paths.

Figure 9:
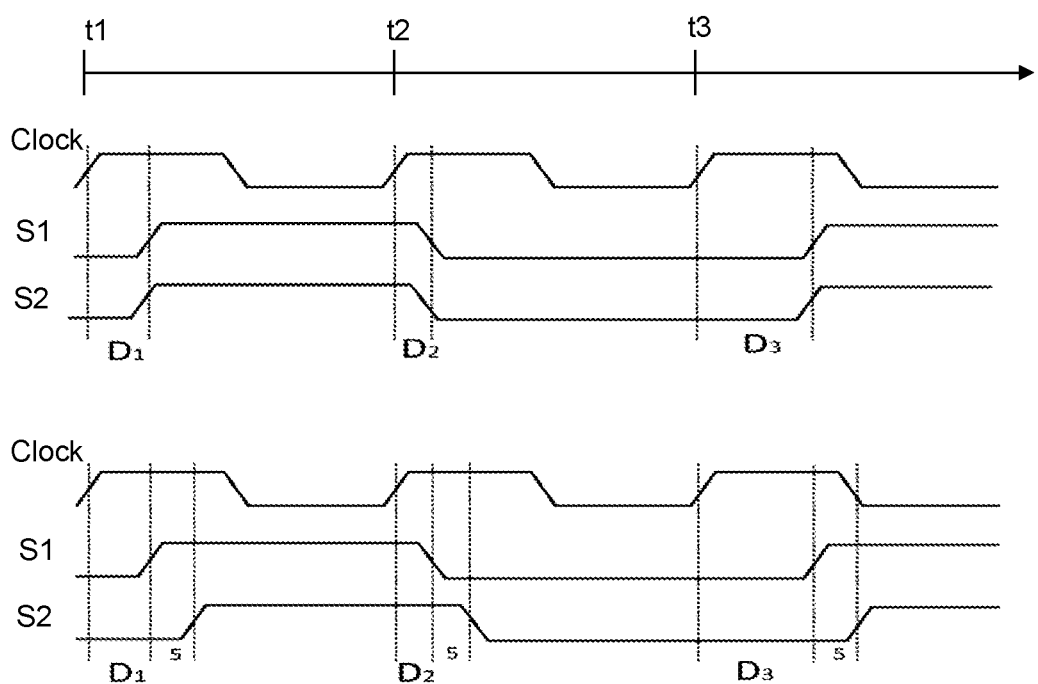
FIG. 9 shows a timing diagram of two signal delays for IC margin measurement and failure prediction.

Reference is now made to FIG. 9 (upper diagram), which shows a timing diagram of two signal delays for IC failure prediction. The multiple signals are switched simultaneously, with equal delay and logic value at each cycle. The duplicate signals are implemented with the smallest margin. The maximum value of [Xi+di] is shown, where delay of the duplicated paths was increased by 15 time-units. Both paths implement the same degradation.

Figure 10:
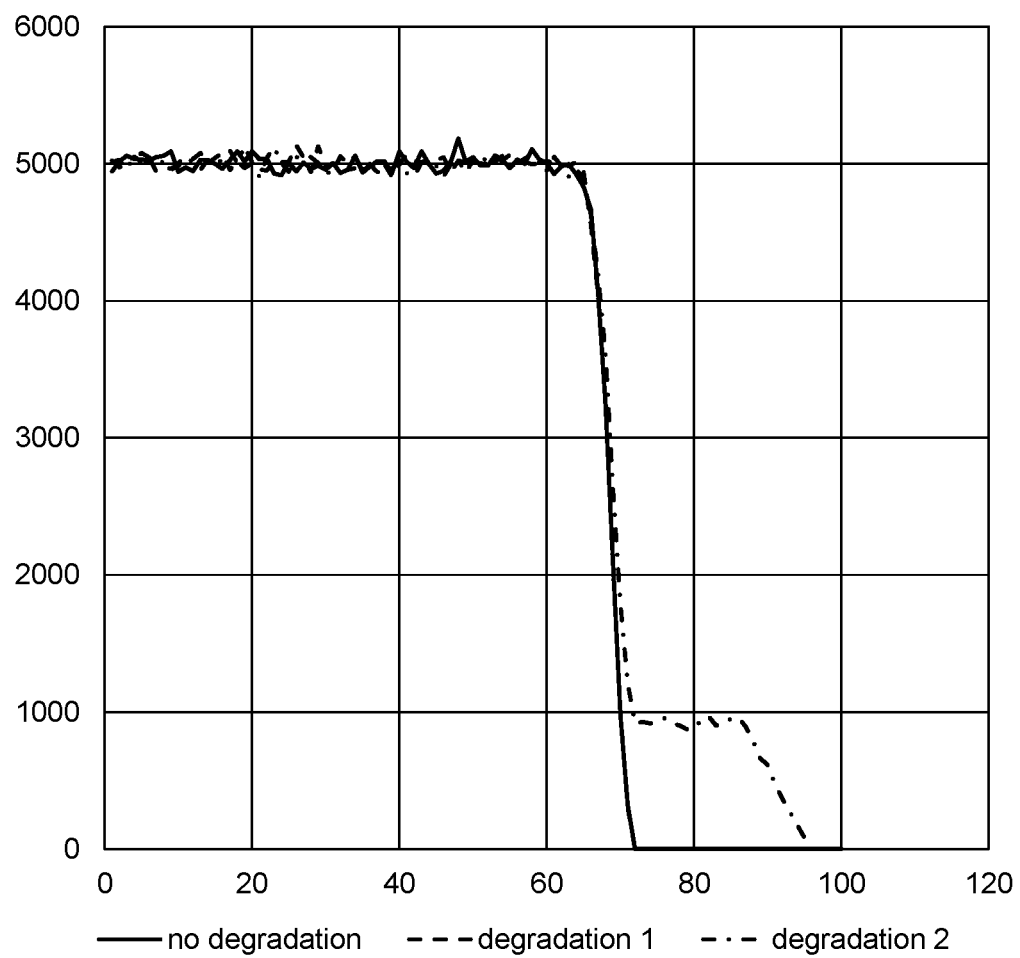
FIG. 10 shows a graph of errors versus cycle time for a third experiment.

Reference is now made to FIG. 10, which shows a graph of errors versus cycle time for a third experiment. The solid line represents no degradation, the dashed line (similar to the solid line) represents a first degradation scenario (FIG. 9 upper line), and the dot-dashed line represents a second degradation scenario in which the delay of one of the duplicated paths was increased by an additional 5 time-units (FIG. 9 lower line). Note that the delays of the replica signal are smaller by 5 time-units with respect to the base signal. The two paths are logically identical, but implement different timing degradations. The minimum margin was equal to 25 time-units, such as [100-75]. In a first degradation scenario (dashed line), the system may not detect the change in the margin. MaxD2 at failure equals 75 time-units for both scenarios. In a second degradation scenario (dot-dashed line), the system detects the change in the margin. MaxD2 at failure was 95 time-units.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the application, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein, and in particular the various thicknesses and compositions of various layers, are illustrative of exemplary embodiments, and should not be viewed as limiting the invention to such specific implementation choices. Accordingly, plural instances may be provided for components described herein as a single instance.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., flash memory cards, ROM), or electronic medium and a network, wireline, wireless or other communications medium.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the preferred embodiments are described in the context of one of a number of specific circuit designs for a semiconductor IC, the teachings of the present invention are believed advantageous for use with other types of semiconductor IC circuitry. Moreover, the techniques described herein may also be applied to other types of circuit applications. Accordingly, other variations, modifications, additions, and improvements may fall within the scope of the invention as defined in the claims that follow.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. Combinations of features and/or aspects as disclosed herein are also possible, even between different embodiments of FPC or MFPC or other designs and/or drawings of other features. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A semiconductor integrated circuit (IC) comprising:
    a data path comprising parallel bit paths, each of the parallel bit paths terminating with a flip-flop; and
    a margin measurement circuit comprising:
        a signal path combiner comprising a plurality of input paths and an output, the output being based on a combination of respective signals received on each of the input paths, wherein:
            the signals are inputs to the flip-flops of the data path, wherein the flip-flops are grouped together with respect to a certain a clock enable, and
            the input paths are each connected to an input of a different one of the flip-flops of the data path, such that the signals received on the input paths are each a respective signal received by the respective flip-flop of the data path;
        a delay circuit having an output and an input that is electrically connected to the signal path combiner output, wherein the delay circuit is configured to apply, at different times, respective delays of differing lengths to a signal received at the input of the delay circuit, to provide, at the output of the delay circuit, different delayed signals respective of the different delays; and
        a comparison circuit arranged to:
            provide comparison outputs each based on a comparison of the output of the signal path combiner with a different one of the delayed signals, and
            provide the comparison outputs as at least one comparison data signal.

2. The IC of claim 1, wherein said signal path combiner is selected from the group consisting of: a logical XOR combiner, a Hamming parity combiner, and a multiplexer.

3. The IC of claim 2, wherein said signal path combiner is the logical XOR combiner, and wherein the IC further comprises:
    a first flip-flop connected to receive (a) input from the output of the logical XOR combiner, in parallel to said delay circuit, and (b) a clock signal;
    a second flip-flop connected to receive (a) the output of said delay circuit, and (b) the clock signal;
    a XOR component connected to receive (a) an output of said first flip-flop, and (b) an output of said second flip-flop.

4. The IC of claim 3, wherein said XOR component is configured to output a logical 1 when only one of
    the output of said logical XOR combiner, and
    one of the delayed signals,
    is a logical 1 during the clock signal.

5. The IC of claim 2, wherein said signal path combiner is the Hamming parity combiner, which is configured to compress the signals received on the input paths into a Hamming space.

6. The IC of claim 2, wherein said signal path combiner is the multiplexer, which is configured to select one or more of the signals of the input paths for delay by said delay circuit.

7. The IC of claim 1, further comprising:
    a first internal storage circuit, electrically connected to the signal path combiner output and arranged to provide the stored signal path combiner output as a first input to the comparison circuit; and
    a second internal storage circuit, electrically connected to receive each of the delayed signals and arranged to provide the respective stored delayed signal as a second input to the comparison circuit.

8. The IC of claim 1, wherein the signal path combiner is a first signal path combiner arranged to receive a plurality of signals from a first data source and wherein the comparison circuit is a first comparison circuit, the IC further comprising:
    a second signal path combiner, comprising a second set of input paths and an output which is based on a combination of respective signals received on each of the input paths of the second set from a second data source;
    a multiplexer, configured to receive the first signal path combiner output, the second signal path combiner output, and a selection signal, and to selectively output the first signal path combiner output or the second signal path combiner output based on the selection signal, the output of the multiplexer being provided as the input to the delay circuit;

a second comparison circuit arranged to provide a second set of comparison outputs based on comparisons of the second signal path combiner output and the delayed signals; and an OR gate arranged to receive as inputs the comparison outputs of the first comparison circuit and the comparison outputs of the second comparison output, to provide the at least one comparison data signal.

9. The IC of claim 8, further comprising:

a first comparison storage circuit, arranged to receive each of the first comparison outputs and controlled by a first clock signal; and a second comparison storage circuit, arranged to receive each of the second comparison outputs and controlled by a second clock signal, wherein the first comparison storage circuit is arranged to provide each of the first comparison output as a first input to the OR gate, and the second comparison storage circuit is arranged to provide each of the second comparison output as a second input to the OR gate.

10. The IC of claim 1, further comprising a circuit configured to measure a minimal delay margin among delay margins of the input paths of said signal path combiner.

11. The IC of claim 10, wherein the circuit that is configured to measure the minimal delay margin is a failure analysis circuit that is further configured to predict future failure of the IC based on analyzing a change in the minimal delay margin over time.

12. A system comprising:

a computerized server; and the IC of claim 1, further comprising a data transmission circuit configured to transmit the at least one comparison data signal to said computerized server, wherein said computerized server is configured to:
receive the at least one comparison data signal,
perform a failure prediction analysis of the at least one comparison data signal, and
when the failure prediction analysis predicts failure of the IC within a predefined time, send a notification of the predicted failure to the IC.

13. The IC of claim 2, wherein said signal path combiner is the logical XOR combiner, and wherein the IC further comprises:

a XOR component connected to receive (a) an output of said logical XOR combiner, and (b) an output of said delay circuit;

a flip-flop connected to receive (a) input from the output of the XOR component, and (b) a clock signal.

14. The IC of claim 13, wherein said XOR component is configured to output a logical 1 when only one of
the output of said logical XOR combiner, and
one of the delayed signals,
is a logical 1 during the clock signal.

15. The IC of claim 2, wherein said signal path combiner is the logical XOR combiner, and wherein the IC further comprises:

a flip-flop connected to receive (a) the at least one comparison data signal, and (b) a clock signal whose delay is balanced with respect to a delay through said plurality of input paths and said logical XOR combiner.

16. The IC of claim 3, wherein the clock signal has a delay that is balanced with respect to a delay through said plurality of input paths, said logical XOR combiner, and said XOR component.

17. The IC of claim 6, wherein the IC further comprises:

a first flip-flop connected to receive (a) input from the output of said multiplexer, in parallel to said delay circuit, and (b) a clock signal;

a second flip-flop connected to receive (a) the output of said delay circuit, and (b) the clock signal;

a XOR component connected to receive (a) an output of said first flip-flop, and (b) an output of said second flip-flop.

18. The IC of claim 17, wherein said XOR component is configured to output a logical 1 when only one of
the output of said multiplexer, and
one of the delayed signals,
is a logical 1 during the clock signal.

19. The IC of claim 17, wherein the clock signal has a delay that is balanced with respect to a delay through said plurality of input paths, said multiplexer, and said XOR component.

* * * * *